US010539985B2

(12) United States Patent
Beall et al.

(10) Patent No.: US 10,539,985 B2
(45) Date of Patent: Jan. 21, 2020

(54) COMPUTER SYSTEM WITH SIDE PLENUM COOLING

(71) Applicant: Amazon Technologies, Inc., Seattle, WA (US)

(72) Inventors: Christopher Strickland Beall, Woodinville, WA (US); David Edward Bryan, Seattle, WA (US); Darin Lee Frink, Lake Tapps, WA (US)

(73) Assignee: Amazon Technologies, Inc., Seattle, WA (US)

( * ) Notice: Subject to any disclaimer, the term of this patent is extended or adjusted under 35 U.S.C. 154(b) by 0 days.

(21) Appl. No.: 15/295,555

(22) Filed: Oct. 17, 2016

(65) Prior Publication Data

US 2017/0031392 A1 Feb. 2, 2017

Related U.S. Application Data

(63) Continuation of application No. 14/460,075, filed on Aug. 14, 2014, now Pat. No. 9,474,190.

(51) Int. Cl.
*G06F 1/18* (2006.01)
*H05K 7/20* (2006.01)
*H05K 7/14* (2006.01)

(52) U.S. Cl.
CPC ........... *G06F 1/185* (2013.01); *H05K 7/1491* (2013.01); *H05K 7/20145* (2013.01); *H05K 7/20727* (2013.01); *H05K 7/20736* (2013.01)

(58) Field of Classification Search
CPC .. G06F 1/185; H05K 7/1491; H05K 7/20736; H05K 7/20145; H05K 7/20727; G11B 33/142
See application file for complete search history.

(56) References Cited

U.S. PATENT DOCUMENTS

| 7,200,008 | B1 * | 4/2007 | Bhugra ................ G11B 25/043 361/679.21 |
| 8,451,600 | B1 | 5/2013 | Ross |
| 8,743,549 | B2 | 6/2014 | Frink et al. |
| 9,363,926 | B1 * | 6/2016 | Beall .................. H05K 7/20736 |

(Continued)

OTHER PUBLICATIONS

U.S. Appl. No. 14/217,154, filed Mar. 17, 2014, David Edward Bryan.

(Continued)

*Primary Examiner* — Abhishek M Rathod
(74) *Attorney, Agent, or Firm* — Robert C. Kowert; Kowert, Hood, Munyon, Rankin & Goetzel, P.C.

(57) ABSTRACT

A rack-mountable computer system directs separate portions of a cooling airflow from an inlet air plenum in the computer system interior through separate air passages to remove heat from separate portions of a set of heat-producing components. The air passages can preclude a portion of cooling airflow removing heat from a component from being preheated by another component. Plenums and air passages can be established through the arrangement of components in the interior. Components can be arranged in progressive offsets throughout the depth of the interior to vary plenum flow area throughout the depth, which can progressively impede and redirect airflow through the inlet plenum into the air passages. Arrangements can include an angled row, a staggered configuration, etc. The computer system can include a chassis which can translate, while maintaining operation of hot-pluggable electronic components coupled throughout the depth, to enable swapping of hot-pluggable electronic components throughout the interior.

19 Claims, 12 Drawing Sheets

(56) References Cited

U.S. PATENT DOCUMENTS

| | | | |
|---|---|---|---|
| 9,474,190 B1 | 10/2016 | Beall et al. | |
| 2007/0030641 A1* | 2/2007 | Hall | G11B 33/08 361/679.33 |
| 2007/0230111 A1* | 10/2007 | Starr | G11B 33/125 361/679.31 |
| 2007/0233781 A1* | 10/2007 | Starr | G11B 33/126 709/203 |
| 2010/0172087 A1* | 7/2010 | Jeffery | G11B 33/02 361/679.33 |
| 2012/0243170 A1* | 9/2012 | Frink | G06F 1/187 361/679.34 |
| 2013/0050955 A1* | 2/2013 | Shinsato | G06F 1/181 361/727 |
| 2013/0155600 A1 | 6/2013 | Ross et al. | |
| 2014/0204525 A1* | 7/2014 | Pecone | H05K 13/00 361/679.33 |
| 2014/0204537 A1* | 7/2014 | Rust | G11B 33/128 361/727 |
| 2014/0362515 A1* | 12/2014 | Pronozuk | H05K 7/1488 361/679.31 |
| 2015/0062799 A1* | 3/2015 | Wei | H05K 7/20736 361/679.33 |
| 2015/0092340 A1* | 4/2015 | Jau | H05K 7/1487 361/679.39 |

OTHER PUBLICATIONS

U.S. Appl. No. 14/217,149, filed Mar. 17, 2014, David Edward Bryan.
U.S. Appl. No. 14/217,124, filed Mar. 17, 2014, David Edward Bryan.
U.S. Appl. No. 14/217,121, filed Mar. 17, 2014, David Edward Bryan.
U.S. Appl. No. 14/301,274, filed Jun. 10, 2014, Christopher Strickland Beall.
U.S. Appl. No. 14/460,075, filed Aug. 14, 2014, Christopher Strickland Beall et al.

* cited by examiner

COMPUTER SYSTEM WITH SIDE PLENUM COOLING

This application is a continuation of U.S. patent application Ser. No. 14/460,075, filed Aug. 14, 2014, now U.S. Pat. No. 9,474,190, which is hereby incorporated by reference herein in its entirety.

BACKGROUND

Organizations such as on-line retailers, Internet service providers, search providers, financial institutions, universities, and other computing-intensive organizations often conduct computer operations from large scale computing facilities. Such computing facilities house and accommodate a large amount of server, network, and computer equipment to process, store, and exchange data as needed to carry out an organization's operations. Typically, a computer room of a computing facility includes many server racks. Each server rack, in turn, includes many servers and associated computer equipment.

Some computer systems, which can include servers, typically include a number of components that generate waste heat. Such components include printed circuit boards, mass storage devices, power supplies, and processors. For example, some computers with multiple processors may generate 250 watts of waste heat. Some known computer systems include a plurality of such larger, multiple-processor computers that are configured into rack-mounted components, and then are subsequently positioned within a rack system. Some known rack systems include 40 such rack-mounted components and such rack systems will therefore generate as much as 10 kilowatts of waste heat. Moreover, some known data centers include a plurality of such rack systems.

Some servers include a number of components that are mounted in an interior of the server. The components, which can include printed circuit boards (for example, a motherboard) and mass storage devices, can support one or more components that generate waste heat, referred to herein as "heat-producing components". For example, a motherboard can support a central processing unit, and mass storage devices can include hard disk drives which include motors and electronic components that generate heat. Some or all of this heat must be removed from the components to maintain continuous operation of a server. The amount of heat generated by the central processing units, hard disk drives, etc. within a data room may be substantial. Heat may be removed from the heat-producing components via an airflow flowing through a server.

In some cases, cooling systems, including air moving systems, may be used to induce airflow through one or more portions of a data center, including airflow through a rack-mounted server that includes various heat-producing components. However, some servers direct airflow through an interior that includes multiple heat-producing components, so that air removes heat as it passes through the interiors, so that air passing over heat-producing components in a downstream portion of the server has a reduced heat removal capacity relative to air passing over heat-producing components in an upstream portion of the server. As a result, less heat can be removed from downstream heat-producing components than upstream heat-producing components. In some cases, the downstream heat-producing components are more sensitive to heat than the upstream heat-producing components, which can result in a suboptimal configuration.

In some cases, a computer system mounted in a rack includes one or more hot-pluggable electronic components, which can be added, removed, swapped, etc. from a computer system without powering down the computer system. Hot-pluggable electronic components in a computer system are often mounted at an external side of the computer system, including a "front" side through which cooling air is received into the computer system, to enable simplified access to the components for removal, addition, swapping, etc. In addition, mounting hot-pluggable electronic components to an external side of the computer system enables hot swapping without moving the computer system itself. Mounting hot-pluggable electronic components throughout the depth of the computer system interior can hamper hot-swapping efforts while maintaining operations by other hot-pluggable electronic components. First, interior access can require moving at least a portion of the computer system out of a rack, which can impose cable management constraints to maintain operation of hot-pluggable electronic components. In addition, hot-swapping operations can be complicated by space constraints within the computer system interior, as removal or addition of a hot-pluggable electronic component in the interior, while maintaining operations by other installed components, can be complicated by a lack of interior space in which to translate, maneuver, etc. the component to be removed or added. Furthermore, as indicated above, mounting hot-pluggable electronic components throughout the depth of the interior can result in preheating of cooling air which removes heat from some components which are downstream of other components, which can reduce cooling efficiency and can negatively affect component performance.

Figure 1A:
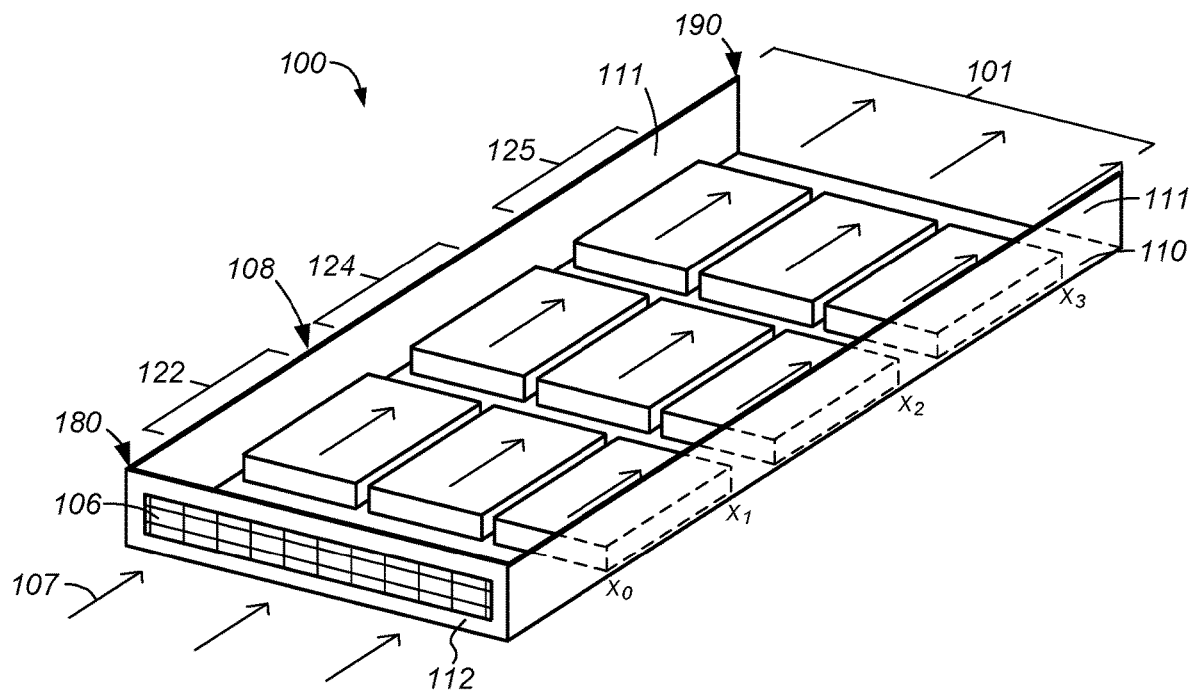
FIG. 1A is a schematic diagram illustrating a perspective view of a computer system that includes heat-producing components installed in upstream portions and downstream portions of the computer system chassis interior, according to some embodiments.

The various embodiments described herein are susceptible to various modifications and alternative forms. Specific embodiments are shown by way of example in the drawings and will herein be described in detail. It should be understood, however, that the drawings and detailed description thereto are not intended to limit the disclosure to the particular form disclosed, but on the contrary, the intention is to cover all modifications, equivalents and alternatives falling within the spirit and scope of the appended claims.

The headings used herein are for organizational purposes only and are not meant to be used to limit the scope of the description or the claims. As used throughout this application, the word "may" is used in a permissive sense (i.e., meaning having the potential to), rather than the mandatory sense (i.e., meaning must). Similarly, the words "include," "including," and "includes" mean including, but not limited to.

DETAILED DESCRIPTION OF EMBODIMENTS

Various embodiments of computer systems, and systems and methods for performing computing operations and removing waste heat from various heat-producing components in computer systems, are disclosed. According to one embodiment, a system for storing data, includes a rack and one or more data storage modules coupled to the rack, where the data storage modules include a chassis that at least partially encompasses a chassis interior, multiple sets of hot-pluggable mass storage devices coupled to the chassis, separate intake air plenums which receive cooling air from a separate intake air vent, at least one exhaust air plenum, and laterally-oriented air passages through each separate set of hot-pluggable mass storage devices. Each set of hot-pluggable mass storage devices extends at least partially through both a depth of the chassis interior and opposite directions through a width of the chassis interior. Each intake air plenum is bounded by a separate intake vent, a separate side of the chassis, and a proximate set of the at least two sets of hot-pluggable mass storage devices. Each set of air passages directs separate portions of cooling air flowing through an adjacent intake air plenum to flow laterally across a portion of a set of hot-pluggable mass storage devices and into the exhaust plenum to remove heat from at least one hot-pluggable mass storage device in the set.

According to one embodiment, a data storage module includes a chassis and a support structure coupled to the chassis and configured to install a set of electronic components to establish separate air plenums and air passages between the plenums which direct separate portions of cooling air flowing through the inlet air plenum to remove heat from at least one electronic component in the set. The chassis includes a base element, inlet end, and an exhaust end that at least partially encompass a chassis interior having orthogonal first and second dimensions in parallel with the base element. The first dimension extends between the inlet end and the exhaust end. The set of electronic components extends through both the first dimension and the second dimension of the chassis interior to establish an inlet air plenum in flow communication with the inlet end and an exhaust plenum in flow communication with the exhaust end. The air passages extend between the inlet air plenum and the exhaust plenum in parallel with the base element and direct a separate portion of cooling air flowing through the inlet air plenum to flow in parallel with the base element and across at least a portion of the set and into the exhaust plenum.

According to one embodiment, a method includes configuring a computer system, which includes a chassis encompassing a chassis interior, to direct separate portions of an intake air flow into the chassis interior to remove heat from separate portions of electronic components in the chassis interior. Such configuring includes coupling several electronic components to one or more support structures coupled to a base element of the chassis to establish a set of electronic components, one or more intake air plenums in the chassis interior, and one or more exhaust plenums in the chassis interior, and air passages between the plenums. The set of electronic components extends through the depth of the chassis interior, physically separate from side ends of the chassis. The intake air plenum is bounded by one side of the set of electronic components, a portion of the base element of the chassis, and is in flow communication with an intake end of the chassis. The exhaust plenum is bounded by an opposite side of the set of electronic components, another portion of the base element of the chassis, and is in flow communication with an exhaust end of the chassis. The air passages direct separate portions of an air flow through the intake air plenums to flow, in parallel with the base element of the chassis across separate portions of the set of electronic components and into the exhaust plenum.

As used herein, "air moving device" includes any device, element, system, or combination thereof that can move air. Examples of air moving devices include fans, blowers, and compressed air systems.

As used herein, "backplane" means a plate or board to which other electronic components, such as mass storage devices, circuit boards, can be mounted. In some embodiments, mass storage devices, which can include one or more hard disk drives, are plugged into a backplane in a generally perpendicular orientation relative to the face of the backplane. In some embodiments, a backplane includes and one or more power buses that can transmit power to components on the backplane, and one or more data buses that can transmit data to and from components installed on the backplane.

As used herein, "circuit board" means any board or plate that has one or more electrical conductors transmitting power, data, or signals from components on or coupled to the circuit board to other components on the board or to external components. In certain embodiments, a circuit board is an epoxy glass board with one or more conductive layers therein. A circuit board may, however, be made of any suitable combination of materials. A circuit board can include a printed circuit board.

As used herein, "chassis" means a structure or element that supports another element or to which other elements can be mounted. A chassis may have any shape or construction, including a frame, a sheet, a plate, a box, a channel, or a combination thereof. In one embodiment, a chassis is made from one or more sheet metal parts. A chassis for a computer system may support circuit board assemblies, power supply units, data storage devices, fans, cables, and other components of the computer system.

As used herein, "computing" includes any operations that can be performed by a computer, such as computation, data storage, data retrieval, or communications.

As used herein, "computer system" includes any of various computer systems, computing devices, or components thereof. One example of a computer system is a rack-mounted server. As used herein, the term computer is not limited to just those integrated circuits referred to in the art as a computer, but broadly refers to a processor, a server, a microcontroller, a microcomputer, a programmable logic controller (PLC), an application specific integrated circuit, and other programmable circuits, and these terms are used interchangeably herein. In the various embodiments, memory may include, but is not limited to, a computer-readable medium, such as a random access memory (RAM). Alternatively, a compact disc-read only memory (CD-ROM), a magneto-optical disk (MOD), and/or a digital versatile disc (DVD) may also be used. Also, additional input channels may include computer peripherals associated with an operator interface such as a mouse and a keyboard. Alternatively, other computer peripherals may also be used that may include, for example, a scanner. Furthermore, in the some embodiments, additional output channels may include an operator interface monitor and/or a printer.

As used herein, "data center" includes any facility or portion of a facility in which computer operations are carried out. A data center may include servers dedicated to specific functions or serving multiple functions. Examples of computer operations include information processing, communications, testing, simulations, power distribution and control, and operational control.

As used herein, to "direct" air includes directing or channeling air, such as to a region or point in space. In various embodiments, air movement for directing air may be induced by creating a high pressure region, a low pressure region, or a combination both. For example, air may be directed downwardly within a chassis by creating a low pressure region at the bottom of the chassis. In some embodiments, air is directed using vanes, panels, plates, baffles, pipes or other structural elements.

As used herein, "member" includes a single element or a combination of two or more elements (for example, a member can include two or more sheet metal parts fastened to one another.

As used herein, a "rack" means a rack, container, frame, or other element or combination of elements that can contain or physically support one or more computer systems.

As used herein, "room" means a room or a space of a building. As used herein, "computer room" means a room of a building in which computer systems, such as rack-mounted servers, are operated.

As used herein, a "space" means a space, area or volume.

As used herein, "shelf" means any element or combination of elements on which an object can be rested. A shelf may include, for example, a plate, a sheet, a tray, a disc, a block, a grid, or a box. A shelf may be rectangular, square, round, or another shape. In some embodiments, a shelf may be one or more rails.

Figure 1B:
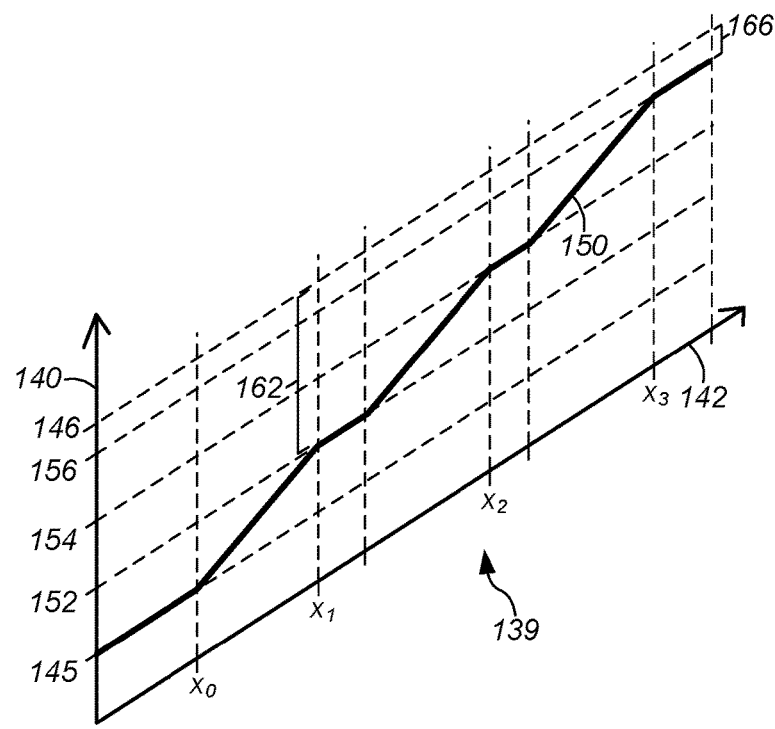
FIG. 1B is a graphical representation of a temperature profile of an airflow through a computer system chassis interior that removes heat from heat-producing components installed in an upstream portion and heat-producing components installed in a downstream portion of a computer system chassis interior, according to some embodiments.

FIG. 1A is a schematic diagram illustrating a perspective view of a computer system that includes heat-producing components installed in upstream portions and downstream portions of the computer system chassis interior, according to some embodiments. FIG. 1B is a graphical representation of a temperature profile of an airflow through a computer system chassis interior that removes heat from heat-producing components installed in an upstream portion and heat-producing components installed in a downstream portion of a computer system chassis interior, according to some embodiments. As used herein, "installing" and "mounting" are used interchangeably.

Computer system 100 includes a chassis 108 that at least partially encompasses a chassis interior 101, upstream heat-producing components 122 that are coupled to a base element 110 of the chassis 108 in an upstream portion of the interior 101, downstream heat-producing components 124, 125 coupled to the base element 110 of the chassis 108 in a downstream portion of the interior, and an inlet air vent 106 in an inlet element 112 on an inlet end 180 of the chassis 108 which directs cooling air 107 into the chassis interior 101 via the inlet end 180. Chassis 108 includes at least a base element 110, side elements 111, and an inlet element 112. Components 122, 124, 125 coupled to the chassis 108 in a portion of the chassis interior 101 can include electronic components that are installed in the chassis interior 101, and installing an electronic component in the chassis interior 101 can include coupling the component to a portion of the chassis, such that the component is mounted in a particular position in the chassis interior 101. One or more electronic components can include one or more heat-producing components and can include one or more hot-pluggable electronic components, including one or more hot-pluggable mass storage devices. Mass storage devices can include one or more hard disk drives (HDDs), solid state drives (SSDs), etc.

In some embodiments, a computer system 100 includes an inlet end 180 that is configured to face into an aisle space when the computer system 100 is mounted in a rack. The aisle space can include a cold aisle that supplies cooling air 107 into the computer system to remove waste heat from heat-producing components installed in the computer system interior. The cooling air 107 can enter the computer system interior, which can include a chassis interior 101, via one or more inlet air vents 106 installed in an inlet end 180 of the computer system. In the illustrated embodiment, for example, chassis 108 includes an inlet element 112 at the inlet end 180 of the computer system 100, where the inlet element 112 includes one or more inlet vents 106 through which cooling air 107 passes into the interior 101. Such cooling air, referred to hereinafter as a "cooling air flow", can flow through the various portions of the interior 101 that are in flow communication with the inlet vents 106 and remove heat from the various heat-producing components, which can be included in one or more of component 122, 124, 125 installed in positions that are in heat transfer communication with the air flow 107.

A component in heat transfer communication with an air plenum, air passage, air flow, etc. can include a component which is installed in the chassis interior in a position that exposes one or more portions of the component to an air flow through an air plenum, air passage, etc. such that the air flow can remove heat from the component. In some embodiments, a component in heat transfer communication with an air plenum, air passage, air flow, etc. includes a component that is at least partially installed within a portion of the air plenum through which an air flow is directed. In some embodiments, an air plenum, air passage, air flow, etc. in heat transfer communication with a component includes an air plenum, air passage, air flow, etc. in which the component is installed, such that one or more portions of the component are exposed to an air flow through the air plenum, air passage, etc. such that the air flow can remove heat from the component.

As shown in the illustrated embodiment, where heat-producing components are mounted throughout the depth of the chassis interior 101 from the inlet end 180 to the exhaust end 190, cooling air 107 which enters the interior 101 can pass from the inlet end 180 towards the exhaust end 190 in successive heat transfer communication with successive sets of heat-producing components 122, 124, 125. A heat-producing component may be referred to as an "upstream heat-producing component" or "downstream heat-producing component" based at least in part upon the heat-producing component being coupled to the chassis at a position which is downstream of another set of heat-producing components with respect to an air flow through the interior. As a result, an air flow which removes heat from one or more downstream heat-producing components, having previously passed in heat transfer communication with one or more upstream heat-producing components, may have been preheated by the upstream heat-producing components prior to passing in heat-transfer communication with the downstream heat-producing components.

In some embodiments, as the cooling air flow 107 passes from the inlet end 180 towards the exhaust end 190 and removes heat from heat-producing components 122, 124, 125 coupled to the chassis 108 in various portions of the chassis interior 101, the air flow 107 progressively increases in temperature and loses heat removal capacity. FIG. 1B shows a graph 139 of a relationship 150 between the temperature 140 of the cooling air flow 107 and the distance 142 through which the air flow 107 passes in the chassis interior 101, illustrated in FIG. 1A, between inlet end 180 and exhaust end 190. As shown in FIG. 1B, the air flow 107 entering the chassis interior 101 at the inlet end 180 has a temperature 145 that corresponds to the temperature of the cooling air external to the computer system 100. As the air flow 107 passes through an upstream portion of the interior 101 that is proximate to the inlet end 180, the air flow 107 removes heat from one or more upstream heat-producing components 122 installed in heat transfer communication with the upstream portion of the interior 101. As further shown in the graph 139 of FIG. 1B, as the air flow 107 removes heat from upstream heat-producing components 122, the temperature 140 of the air flow 107 rises, so that the temperature of the air flow 107 at a location "X1" along the distance 142 through the interior 101, where X1 is a location in the interior 101 that is downstream of the upstream heat-producing components 122, is at a temperature 152 that is elevated over the initial temperature 145 of the air flow 107. The rise in temperature can be due to the air flow 107 removing heat from upstream heat-producing components 122.

As the air flow 107 passes further through the depth of the interior 101 towards exhaust end 190, the air flow 107 flows in heat transfer communication with various downstream heat-producing components 124 installed in the interior 101, and can therefore remove heat from various downstream heat-producing components 124. As a result, as shown in FIG. 1B, the temperature of the air flow 107 continues to increase as it passes across the heat-producing components 124, to temperature 154 at location "X2" and to temperature 156 at location "X3" downstream of the heat-producing components 125 proximate to the exhaust end 190.

Such a temperature pattern of air flow 107 as it passes in heat transfer communication with successive sets of components 122, 124, 125 in interior 101 may be referred to as "preheating" of the air flow 107 with respect to the downstream components 124, 125. Because the air flow 107 which passes in heat transfer communication with the downstream components 124, 125 has already removed heat from upstream components 122, the capacity of the air flow 107 to remove heat from downstream components 124, 125 is reduced, relative to the capacity of the air flow 107 to remove heat from upstream components 122. Such preheating of air flow 107, as shown in FIG. 1A-B, can negatively affect performance of such downstream components 124, 125, as they receive reduced cooling relative to upstream components 122.

In some embodiments, air flow through a computer system is controlled to be optimized against the maximum operating temperatures of the components installed therein. Optimized airflow can include an airflow that maintains an operating temperature of some or all of the components installed in the computer system approximately at their maximum operating temperatures. As a result, a given component receives a sufficient airflow at a sufficiently low temperature to avoid thermal damage, without expending excess airflow across other components.

However, where components are installed in a downstream portion of a computer system, so that a cooling air flow 107 which passes in heat transfer communication with the components is preheated by upstream components, excess airflow may be supplied through the computer system to ensure that the downstream heat-producing components do not incur damage. In the illustrated embodiment of FIG. 1B, for example, while just enough air flow 107 is supplied through the interior 101 to maintain the operating temperature 156 of the exhaust end-proximate downstream components 125 with a minimal margin 166 beneath the maximum operating temperature 146, the upstream components 122 operate at a temperature 152 that is significantly less than the maximum operating temperature 146, as shown by margin 162. Such a significant temperature margin 162 indicates that excess air is being passed in heat transfer communication with the upstream components 122 in order to ensure that the downstream components 125 receive sufficient cooling.

In some embodiments, one or more sets of components 122, 124, 125 in computer system 100 comprise hot-pluggable electronic components, including one or more hot-pluggable mass storage devices. Such hot-pluggable electronic components may be included in upstream components 122, to enable access to the components 122 for hot swapping via the inlet end 180. Based at least in part upon the arrangement of components 122, 124, 125 in the interior 101, which may be an arrangement of components which optimizes component density, hot swapping of components 124 which are not proximate to one or more of inlet end 180 or exhaust end 190 may be complicated by insufficient interior space in which to maneuver a component during hot swapping operations. Furthermore, as noted above, a component mounted in the interior 101, remote from the separate inlet and exhaust ends 180, 190 may receive suboptimal cooling by preheated cooling air flows 107 through the interior 101.

Figure 2:
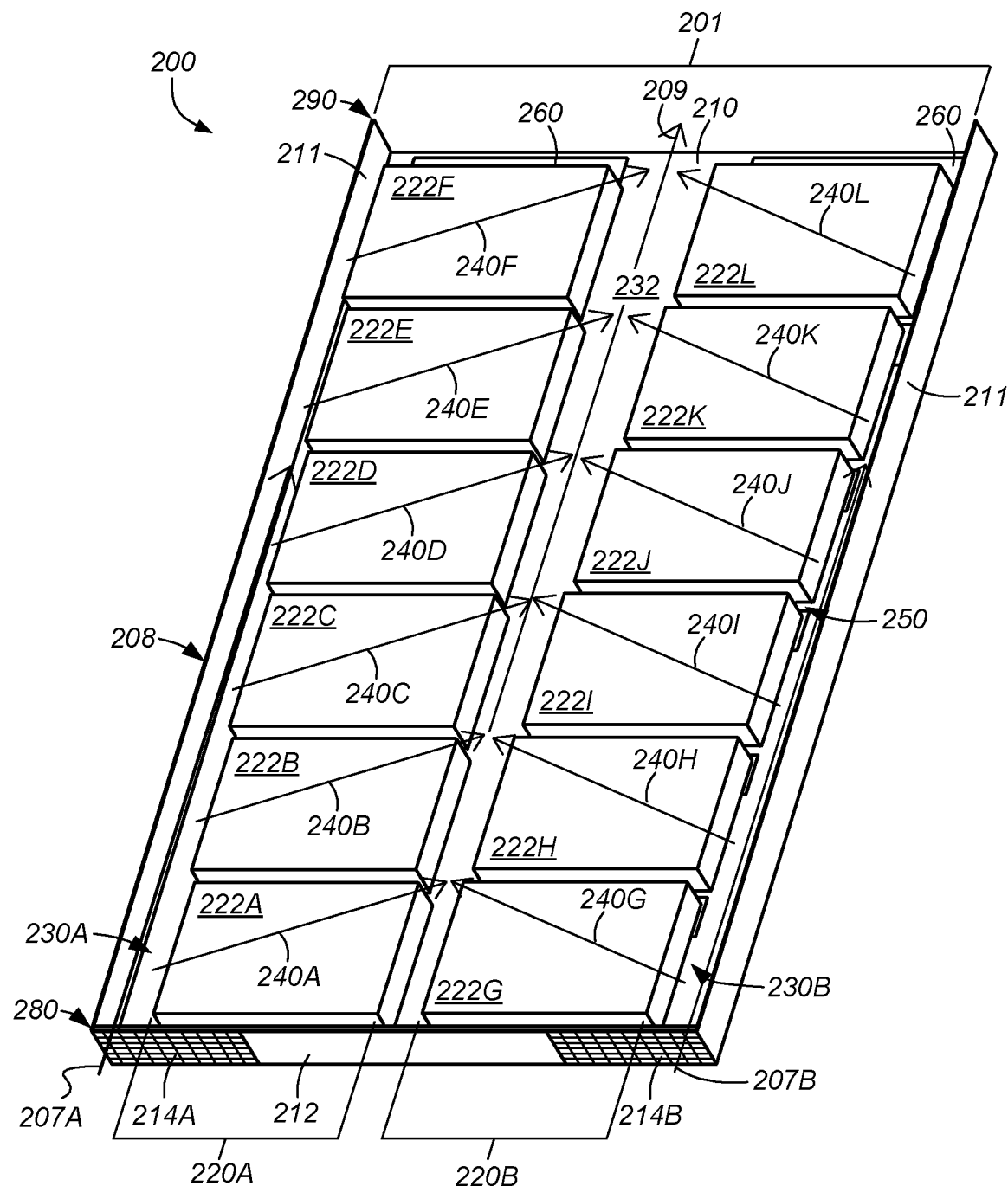
FIG. 2 is a schematic diagram illustrating a perspective view of a computer system that includes separate sets of heat-producing components, each arranged in a staggered configuration, to establish side inlet air plenums and a central exhaust air plenum, and air passages which direct separate portions of cooling air from a given inlet air plenum to flow in heat transfer communication with a separate portion of the components, according to some embodiments.

FIG. 2 is a schematic diagram illustrating a perspective view of a computer system that includes separate sets of heat-producing components, each arranged in a staggered configuration, to establish side inlet air plenums and a central exhaust air plenum, and air passages which direct separate portions of cooling air from a given inlet air plenum to flow in heat transfer communication with a separate portion of the components, according to some embodiments.

Computer system 200 includes a chassis 208, including base element (also referred to herein as "base plate") 210 at a bottom end of the chassis 208, side elements (also referred to herein as "side plates") 211 on side ends of the chassis 208, and inlet element (also referred to herein as "inlet plate") 212 at an inlet end 280 of the chassis 208, that at least partially encompasses a chassis interior 201. Computer system 200 also includes two separate sets 220A-B of components 222A-F, 222G-L, where each set 220A-B is installed in a particular configuration in the chassis interior 201. Each set 220A-B includes a configuration of components 222A-F, 222G-L which are arranged in varied physical distances (also referred to herein as "offsets") from a cross-sectional plane through the depth of the chassis interior 201, from the inlet end 280 to the exhaust end 290. The chassis interior 201 includes separate air plenums 230A-B, 232 and separate sets of air passages 240A-F, 240G-L which enable air flow between separate air plenums to remove heat from various components 222A-F, 222G-L in the separate sets 220A-B. Each set of components 222A-F, 222G-L can each include one or more heat-producing components. Components 222A-F, 222G-L can include one or more electronic components, including one or more mass storage devices, processors, etc. One or more of components 222A-F, 222G-L can include one or more hot-pluggable electronic components.

In some embodiments, one or more sets of components are arranged in a chassis interior to establish separate air plenums, and air passages there between, in the chassis, where each of the air passages is configured to direct a portion of an airflow through one air plenum to flow, at least partially in parallel with a base element of the chassis, in heat transfer communication with a portion of the one or more sets of components and into another air plenum, where one or more of the air plenums are at least partially bounded by separate portions of the base element. In some embodiments, each portion of the airflow can be directed to flow in heat transfer communication with separate portions of a set of components, so that each portion of airflow which removes heat from a given one or more components, in a set of components, is precluded from being preheated by another one or more components in the set. In some embodiments, one or more air passages, air plenums, etc. is at least partially established based at least in part upon on or more support structures coupled to the base element of the chassis and upon which one or more components in a set of components are mounted to arrange the components in one or more particular configurations in the chassis interior.

In the illustrated embodiment, computer system 200 includes two separate sets 220A-B of components which are coupled to the base element 210 of the chassis 208 via one or more support structures 260 coupled to the base element 210 of the chassis 208. The arrangement of each separate set 220A-B of components 222A-F, 222G-L establishes a separate air plenum 230A-B proximate to opposite side ends of the chassis interior 201, so that each separate air plenum 230A-B is at least partially established by a separate set 220 of components 222, a separate side portion of the base element 210, and a separate side element 211. In addition, while each separate set 220A-B of components establishes a separate air plenum 230A-B on one side of the respective set 220A-B, the separate sets 220A-B each establish separate sides of a common air plenum 232 which is distal from the side ends of the chassis 208 and is bounded by a central portion of the base element 210.

In some embodiments, the various air plenums 230A-B, 232 established by the arrangement of the sets 220A-B of components include one or more separate inlet air plenums and exhaust air plenums. Cooling air can be received into each inlet air plenum via one or more separate inlet air vents, and separate portions of the cooling air flowing through a given inlet air plenum can be directed, via separate air passages at least partially established by one or more sets of components, to flow in heat transfer communication with separate portions of the one or more sets of components and into one or more exhaust air plenums in the chassis interior to remove heat from the one or more sets of components.

In the illustrated embodiment, air plenums 230A-B are inlet air plenums which are each in flow communication with separate inlet air vents 214A-B in the inlet element 212 at the inlet end 280 of the chassis 208. Separate cooling air flows 207A-B are received into the separate inlet air plenums 230A-B via the separate inlet air vents 214A-B. Each separate set 220A-B of components 222 includes multiple separate air passages 240A-F, 240G-L between a separate respective inlet air plenum 230A-B and the exhaust air plenum 232. In some embodiments, each separate air passage 240 directs a separate portion of cooling air 207 flowing through a proximate inlet air plenum 230A-B to flow, in parallel with base element 210, in heat transfer communication with a separate component 222 to remove heat from that respective separate component. As a result, preheating of cooling air flows across each separate component 222 can be at least partially or fully mitigated. In the illustrated embodiment, air passages 240 directing air to flow in parallel with the base element 210 directs air to flow laterally between a given inlet air plenum 230 and exhaust air plenum 232. In some embodiments, where base element 210 extends through a vertical plane, each separate set of air passages 240A-F, 240G-L directs air to flow at least partially in opposite vertical directions in parallel with the base element 210. In some embodiments, multiple separate air passages 240 extend in heat transfer communication with a common portion of components 222 in a set 220. For example, in the illustrated embodiment, a top air passage 240 may extend over a top surface of component 222B and a bottom air passage 240 may extend between a bottom surface of component 222B and a portion of base element 210, where the top air passage 240 may additionally flow in heat transfer communication with the top surface of component 222C while the bottom air passage 240 is substantially restricted (i.e., restricted within the manufacturing and material tolerances of various elements establishing the air passage) to flow in heat transfer communication exclusively with component 222B. A bottom air passage 240 may be established based at least in part upon a bottom surface of a given component 222, a portion of the base element 210, and one or more support structures 260 to which the given component 222 is coupled.

The various air passages 240 can enable the various separate portions of cooling air 207A-B flowing through a respective inlet air plenum 230A-B to flow, in parallel with the base element 210, into a common exhaust air plenum 232 and pass out of the chassis interior 201 as exhaust air flow 209, via the exhaust end 290 of the chassis 208. The exhaust end 290 may not be encompassed by a portion of the chassis, as shown in the illustrated embodiment.

In some embodiments, computer system 200 includes a common inlet air plenum, distal from side ends of the chassis 208, from which separate portions of a cooling air flow through the inlet air plenum are directed into one of separate exhaust air plenums via separate sets of air passages which each flow in heat transfer communication with separate portions of one or more separate sets of components which establish side boundaries of the common inlet air plenum. For example, the illustrated computer system 200 may be reversed, such that end 290 is the inlet end, end 280 is the exhaust end, element 212 is at the inlet end 290 instead of the exhaust end 280, air plenum 232 is an inlet air plenum, air plenum 230A-B are separate exhaust air plenums, the illustrated air flow lines are the reverse of the illustrated flow lines in FIG. 2, and the air passages 240 each direct separate portions of air flow from plenum 232 to a separate one of the plenums 230A-B.

In some embodiments, one or more air passages which flow in heat transfer communication with one or more heat-producing components between separate air plenums in a chassis interior are established between adjacent side ends of components coupled to the chassis via one or more support structures. In the illustrated embodiment, each gap 250 between adjacent components 222 can include an air passage between a respective inlet air plenum 230A-B and exhaust plenum 232.

In some embodiments, each set of components in a chassis interior is arranged in a particular configuration, which establishes a variable cross-sectional flow area of one or more air plenums in the chassis interior. For example, one or more sets of components can include an arrangement of components which, in the illustrated embodiment of FIG. 2, each separate set 220A-B of components 222 is arranged in a staggered configuration, where components 222F, 222L in sets 220A-B which are proximate to exhaust end 290 are also each proximate to a separate side element 211 of the chassis 208, relative to components 222A, 222G in the same respective set 220A-B which are proximate to the inlet end 280. In some embodiments, the arrangement of components 222 in one or more sets 220A-B of components at least partially establishes an air plenum which progressively decreases in flow area, in a direction that is in parallel to the base element 210, from the inlet end 280 towards the exhaust end 290, also referred to herein as narrowing of the air plenum, at least partially establishes an air plenum which progressively increases in flow area, in a direction that is in parallel to the base element 210, from the inlet end towards the exhaust end 290, also referred to herein as widening of the air plenum, etc.

In some embodiments, variable flow areas in an air plenum, throughout the depth of the chassis interior, can at least partially impede air flow through the separate air passages 240 which are in flow communication with the respective air plenum. For example, where the flow area of the respective inlet air plenums 230A-B progressively narrows from the inlet end 280 toward the exhaust end 290, the flow direction of cooling air through the respective inlet air plenums 230A-B towards the exhaust end 290 is progressively impeded. Such progressive impedance of air flow through an air plenum can be based at least in part upon one or more of the arrangement of components 222, support structures 260, etc. which at least partially establish the boundaries of the air plenum.

Figure 3:
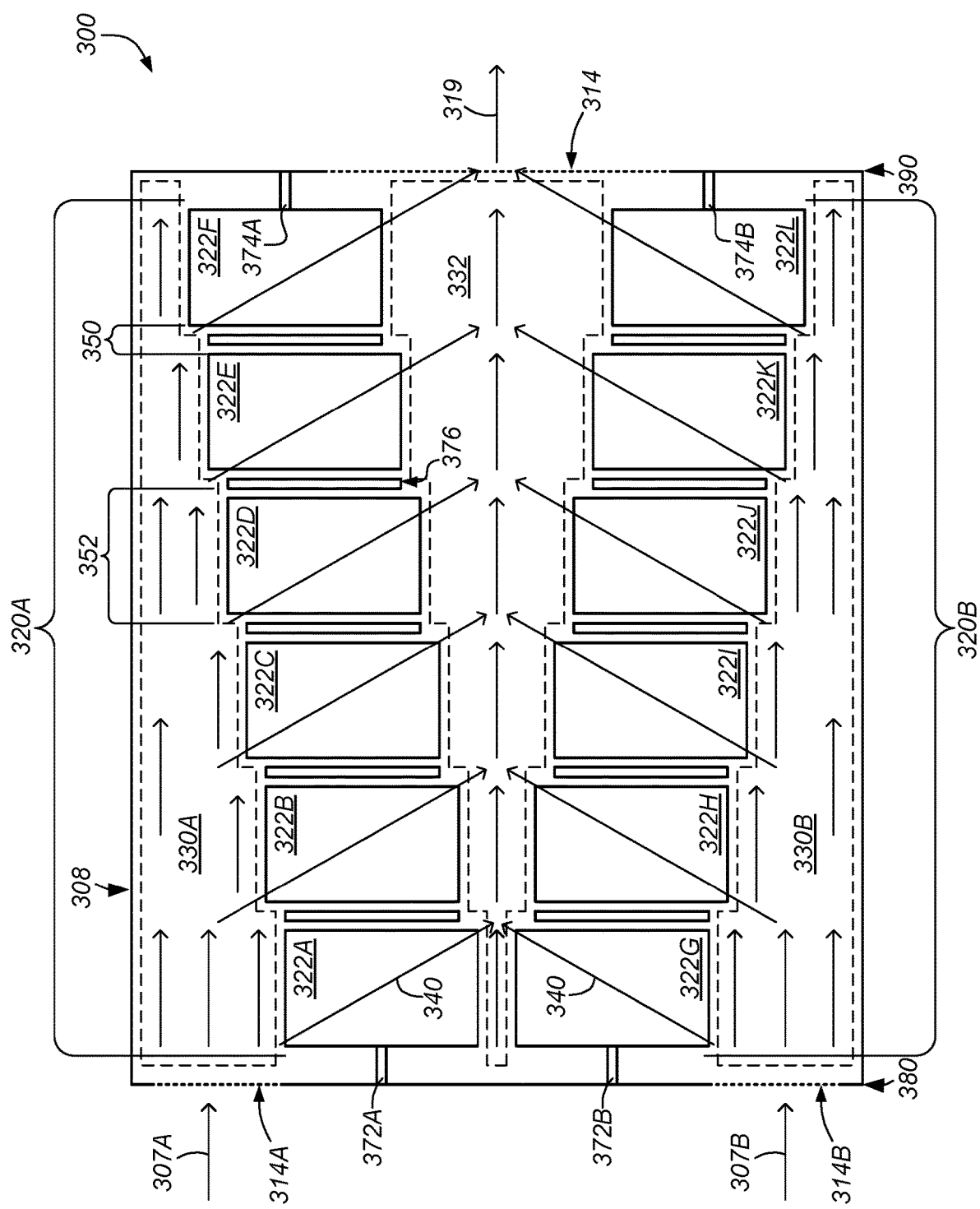
FIG. 3 is a schematic diagram illustrating a top view of a computer system that includes separate sets of heat-producing components, each arranged in a staggered configuration, to establish side inlet air plenums and a central exhaust air plenum, and partitioned air passages which direct separate portions of cooling air from a given inlet air plenum to flow in heat transfer communication with a separate portion of the components, according to some embodiments.

FIG. 3 is a schematic diagram illustrating a top view of a computer system that includes separate sets of heat-producing components, each arranged in a staggered configuration, to establish side inlet air plenums and a central exhaust air plenum, and partitioned air passages which direct separate portions of cooling air from a given inlet air plenum to flow in heat transfer communication with a separate portion of the components, according to some embodiments.

Computer system 300 includes separate sets 320A-B of components 322A-F, 322G-L mounted in the interior of chassis 308 in separate arrangements which establish separate air plenums 330A-B, 332 in the chassis interior and separate sets of air passages 340 across separate portions of the separate sets 320A-B, 320G-L of components. As shown, each separate air passage 340 directs a separate portion of a separate cooling air flow 307A-B through a proximate inlet air plenum 330A-B to flow in heat transfer communication with a separate portion of components 322 of a given set 320 of components. In some embodiments, each air passage 340 directs a separate portion of air to flow at least partially in parallel with a base element, to which the one or more components 322A-L are coupled, of chassis 308.

In some embodiments, each air passage 340 is at least partially established by one or more divider elements 376 which establish slots 352 in the chassis 308 in which separate components 322 are mounted. Dividers 376 can be coupled to a chassis 308, directly, via coupling to one or more support structures in the chassis 308, some combination thereof, or the like. A given divider 376 can be configured to be located within a gap space 350 between adjacent components 322 mounted in the chassis interior. As a result, the divider 376 can both align two or more components 322 mounted in the chassis interior and partition separate air passages 340, so that air passing through a given air passage 340 is restricted from flowing at least partially into another air passage. As a result, removing heat from a given component 322 with air which has been preheated through heat removal from another component 322 in the same set 320 can be at least partially mitigated.

In some embodiments, where one or more air passages progressively narrow from an inlet end to an exhaust end of the chassis, the air passages progressively impede an airflow through the air passages from the inlet end towards the exhaust end. Airflow may be progressively impeded corresponding to changes in cross-sectional flow area of the air passages. For example, where air plenums 330A-B progressively narrow from inlet end 380 towards exhaust end 390, the airflow 307A-B through each separate plenum 330A-B may become progressively more impeded, also referred to as being progressively impeded, as the cross sectional flow area of the respective plenum 330A-B decreases along its length between ends 380 and 390. Progressive impedance of flow through a plenum 330A-B at each change in cross sectional area can divert at least a portion of the airflow 307A-B in the respective plenum 330A-B to be supplied out of the plenum 330A-B into at least one air passage 340 extending in heat transfer communication with at least one component 322 mounted in the chassis 308. The increased impedance may create a pressure gradient that diverts air through passages 340 with reduced relative impedance relative to the plenum 330A-B at the point of increased impedance.

In some embodiments, progressively increased impedance of airflow through one or more of the inlet air plenums 330A-B can enable airflow rates out of the respective plenum 330A-B through each of the air passages 340 extending across one or more components 322, as illustrated in FIG. 3, to maintain one or more flow properties without one or more predetermined tolerance ranges. For example, progressively impeding flow through a given inlet air plenum 330A-B can enable airflow out of the respective plenum 330A-B and across a component 322 proximate to the exhaust end 390 to have an airflow velocity, air mass flow rate, air volumetric flow rate, etc. that is similar to a corresponding flow characteristic of airflow out of the same plenum 330A-B at a relatively less impeded location in the plenum 330A-B and across another component 322 proximate to the inlet end 380.

In some embodiments, where the progressive narrowing of one or more air plenums 330A-B is established based at least in part upon the staggered configuration of the components 322A-F, 322G-L in one or more sets 320A-B of components, the components may be mounted to the chassis 308 in a staggered configuration that establishes one or more of separate inlet air plenums 330A-B that progressively narrow such that airflow 307 through the given plenum 330 is progressively impeded along the depth of the chassis 308, between ends 380 and 390, in the direction of cooling air flow 307 and maintains one or more airflow characteristics that exceed one or more predetermined threshold values of the flow characteristics.

In some embodiments, a computer system includes one or more baffle elements which span between one end of a set of components and a proximate end of the chassis to at least partially partition separate portions of the chassis interior into separate air plenums. As shown in FIG. 3, a set 320 of components 322 extends through a depth of the chassis interior and through another dimension which is orthogonal to the depth of the chassis interior and can include one or more of a width or height of the chassis interior. Each set 3420 of components 322 is separate from physical contact with any of the side ends, inlet end 380, exhaust end 390, etc. baffle elements 372A-B, which each span between an inlet-proximate end of a separate set 320A-B and the inlet end 380 of the chassis 308, and baffle elements 374A-B, which each span between an exhaust-proximate end of a separate set 320A-B and the exhaust end 390 of the chassis 308, partition the portions of the chassis interior which are not partitioned by the sets 320A-B of components 322 into separate air plenums 330A-B, 332. Such partitioning precludes portions of the cooling air flows 307A-B into the respective inlet air plenums 330A-B, via respective inlet air vents 314A-B, from bypassing the components 322A-L and flowing directly into exhaust plenum 332 via gaps between the sets 320A-B and the ends of the chassis at either the inlet end 380 or the exhaust end 390. As a result, an entirety of exhaust air 309 which can exit the chassis 308 via one or more exhaust vents 319 at exhaust end 390 has removed heat from one or more of components 322A-L mounted in the chassis 308.

In some embodiments, some or all of computer system 300 is included in one or more of the computer systems illustrated herein, including computer system 200, illustrated in FIG. 2.

Figure 4:
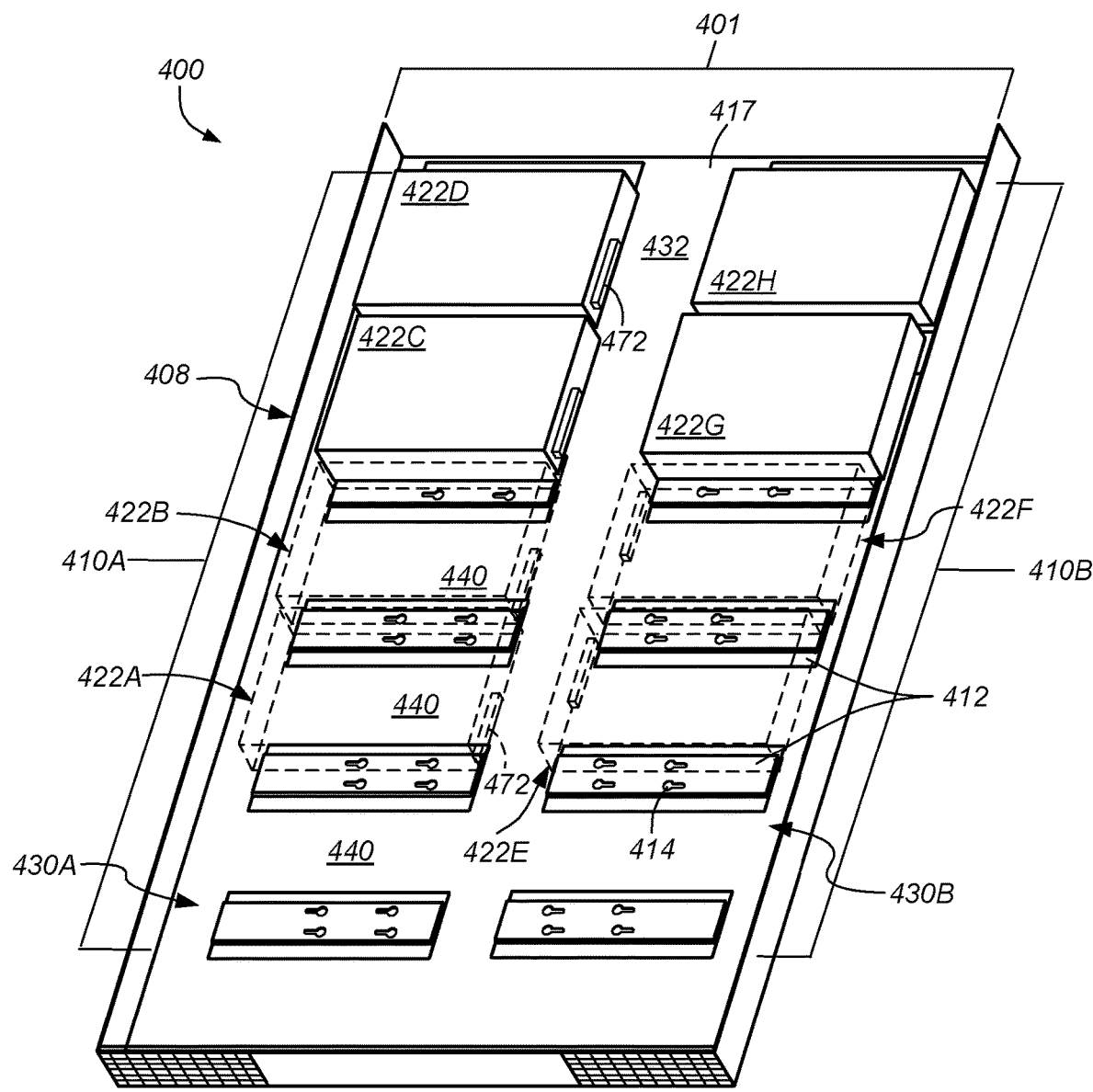
FIG. 4 is a schematic diagram illustrating a perspective view of a computer system that includes support structures coupled to the computer system chassis in arrangements to enable heat-producing components to be installed in staggered configurations to establish various air plenums and air passages in the interior, according to some embodiments.

FIG. 4 is a schematic diagram illustrating a perspective view of a computer system that includes support structures coupled to the computer system chassis in arrangements to enable heat-producing components to be installed in staggered configurations to establish various air plenums and air passages in the interior, according to some embodiments.

Computer system 400 includes a chassis 408 which at least partially encompasses a chassis interior 401, in which separate sets 410A-B of support structures 412 are coupled to a base element 417 of the chassis 408 in one or more separate configurations. In some embodiments, a set 410 of support structures 412 comprises a single backplane structure to which multiple heat-producing components can be coupled to establish a set of such components in the chassis interior 401. In the illustrated embodiment, each set 410 of components comprises a set of multiple separate support structures 412 which are each configured to be coupled to by a portion of one or more heat-producing components, so that a given set 410 of support structures 412 are configured to be coupled to by a set of components 422.

In some embodiments, each set of support structures is coupled to a chassis in a particular arrangement which is configured to arrange a set of heat-producing components coupled to the support structures in a particular configuration which establishes one or more air plenums, air passages, etc. For example, in the illustrated embodiment, each separate set 410 of support structures is coupled to the base element 417 of the chassis 408 in a staggered configuration which configures the respective set 410 of support structures 412 to arrange a set of components 422 coupled to the set of support structures in a staggered configuration in the chassis interior 401.

Support structures can include one or more various types of support structures. As noted above, a set of support structures can include a backplane to which one or more heat-producing components 422 can be coupled. Such a backplane can include a horizontally-oriented backplane upon which one or more components 422 can be mounted, a vertically-oriented backplane to which one or more components can be coupled, etc. in the illustrated embodiment, each support structure 412 comprises a central raised portion which projects away from the base element 410 of the chassis 408 to which separate edge portions are physically coupled. "Keyhole" slots 414 in the central raised portion are configured to receive one or more coupling elements projecting from one or more components 422 to couple the one or more components 422 to the one or more support structures 412 via the keyhole slots 414. In some embodiments, coupling a component 422 with a support structure 412 via a keyhole slot 414 includes inserting a coupling element of the component 422 into a wide portion of the keyhole slot 414 and sliding the component 422 so that the coupling portion couples with a narrowing portion of the keyhole slot 414. In some embodiments, a pin structure can be inserted through a component 422 to couple with a keyhole slot 414 of a support structure 412 to couple the component 422 to the support structure 412.

In some embodiments, a set 410A-B of support structures 412 is configured to at least partially establish one or more air passages between separate portions of the chassis interior 401, including separate air plenums 430A-B, 432. Where a set 410 of support structures includes multiple separate support structures 412, the separate support structures 412 can be coupled to the base element 417 of a chassis 408 in a spaced arrangement which establishes one or more gaps 440 between separate support structures 412 in a given set 410. As shown with regard to components 422A-B, where the support structures 412 each include a raised portion which projects away from the base element 417 of the chassis interior 401, coupling one or more components 422A-B to the raised portions of the support structures 412 can establish separate upper boundaries of separate air passages through the separate gaps 440 between separate support structures 412.

In some embodiments, one or more support structures are configured to be coupled to by one or more heat-producing components in a particular configuration which arranges the components to face respective interface ports towards a common portion of the chassis interior which is included in a common air plenum. Interface ports of a given component can include one or more electrical power interface ports, communication interface port, etc. A common portion of the chassis interior can include a common exhaust air plenum into which separate portions of cooling air are directed from separate inlet air plenums, via separate air passages which are in heat transfer communication with separate heat-producing components. In the illustrated embodiment, each of components 422 are coupled to various support structures 412 in arrangements which face one or more interfaces 472 of the separate components 422A-H toward a portion of the chassis interior 401 which is included in an exhaust plenum 432 established at least partially by the coupled components 422A-H. As a result, communication pathways, electrical pathways, etc. can be routed to each of the coupled components 422A-H, from an external source, through the common established air plenum 432 to which the various interfaces 472 face. In some embodiments, the various pathways comprise one or more instances of cabling, where each separate instance of cabling couples a separate component 422 to an external source, which can include an external power source, and external computer system, instance of processing circuitry, communication network, etc.

In some embodiments, some or all of computer system 400 is included in one or more of the computer systems illustrated herein, including computer system 200, illustrated in FIG. 2.

Figure 5:
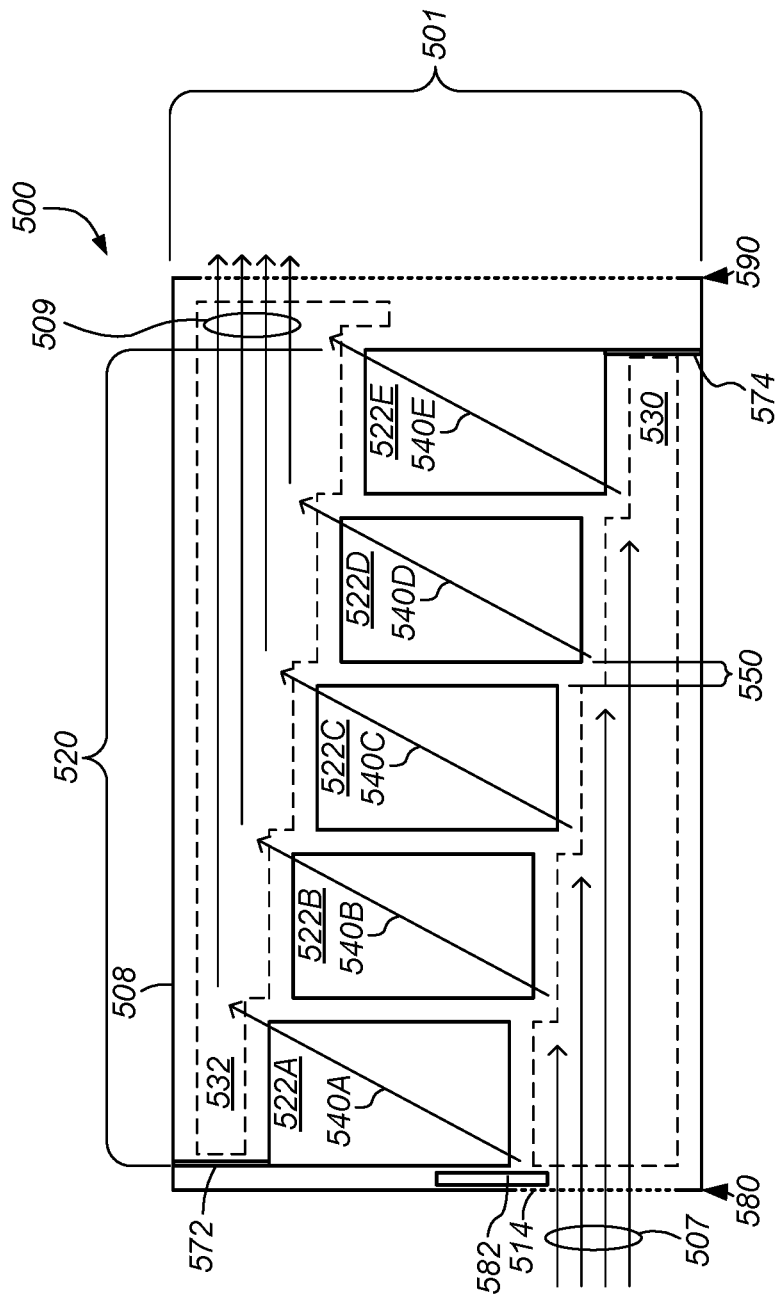
FIG. 5 is a schematic diagram illustrating a top view of a computer system that includes a set of heat-producing components arranged in a staggered configuration through the depth of the computer system to establish a separate inlet air plenum and exhaust air plenum through the depth of the computer system interior, and air passages which direct separate portions of cooling air from the inlet air plenum to flow in heat transfer communication with a separate portion of the components, according to some embodiments.

FIG. 5 is a schematic diagram illustrating a top view of a computer system that includes a set of heat-producing components arranged in a staggered configuration through the depth of the computer system to establish a separate inlet air plenum and exhaust air plenum through the depth of the computer system interior, and air passages which direct separate portions of cooling air from the inlet air plenum to flow in heat transfer communication with a separate portion of the components, according to some embodiments.

Computer system 500 includes a chassis 508, having an inlet end 580 and an exhaust end 590, which at least partially encompasses a chassis interior 501. In some embodiments, the chassis 508 includes side ends which extend between the inlet end 580 and exhaust end 590. One or more of the ends of the chassis can be encompassed by one or more chassis elements. For example, in the illustrated embodiment, chassis 508 includes a base element encompassing a bottom end of the chassis interior 501, and an inlet element at least partially encompassing the inlet end 580 of the chassis interior 501, where the inlet element includes one or more inlet vents 514 which enable cooling air flow 507 into the chassis interior 501 from an external environment via the inlet end 580. In some embodiments, the side ends of the chassis 508 are not encompassed by one or more elements. Furthermore, as shown in the illustrated embodiment, the exhaust end 590 is at least partially unencompassed by any elements.

Computer system 500 includes a set 520 of components 522A-E installed in the chassis 508. The components 522A-E can be coupled to one or more support structures coupled to the chassis to at least partially install the components 522A-E in the chassis. One or more of components 522 can include one or more various electronic components, including one or more mass storage devices, instances of processor circuitry, etc. One or more of components 522A-E can include one or more hot-pluggable electronic components, including one or more hot-pluggable hard disk drives. Support structures can include one or more backplane structures.

As shown, a set 520 of components 522 can be installed in the chassis 508 in a particular arrangement. As a result, the installed components 522A-E establish one or more air plenums 530, 532 in the chassis interior and one or more air passages 540A-E between the separate air plenums, where each separate air passage 540A-E extends, at least partially parallel to a base element of chassis 508, in heat transfer communication with at least a separate corresponding component 522A-E between the separate air plenums 530, 532 at separate locations through the depth of the chassis interior 501 between the inlet end 580 and the exhaust end 590.

The arrangement of the components 522 at least partially establishes a shape of the air plenums 530, 532 in the chassis interior 501, including various cross-sectional flow areas of each air plenum at various distances through the depth of the chassis interior 501 between the inlet end 580 and the exhaust end 590. In some embodiments, an arrangement of components 522 in a set of components 520 extends through two separate dimensions in the chassis interior. For example, a set of components can be arranged in a configuration which extends through both a first dimension and a second dimension that is orthogonal to the first dimension, where both the first and second dimension extend in parallel to a base element of the chassis 508. In the illustrated embodiment, the set 520 of components 522A-E extends through both a first dimension, the depth of the chassis interior between the inlet end 580 and the exhaust end 590, and through a second dimension between opposite side ends of the chassis interior 501. In the illustrated embodiment, the second dimension is a width of the chassis interior 501.

In some embodiments, where the base element extends through a vertical plane, the second dimension is a height of the chassis interior 501 between and top end and a bottom end of the chassis interior. The illustrated set 520 of components is arranged in a staggered configuration, wherein the components 522A-E are progressively offset, in a direction which is parallel to the base element of the chassis 508, from one or more of the side ends of the chassis 508 throughout the depth of the chassis interior. As a result of the staggered configuration of the set 520 of components 522, the cross-sectional flow areas of both air plenums 530, 532 progressively change, in a direction which is parallel to the base element, throughout the depth of the chassis interior 501. Changes in one or more of cross-sectional flow area of one or more air plenums, offsets of a set of components installed in the chassis interior, etc. can be continuous, step-changed, some combination thereof, or the like. In the illustrated embodiment, for example, both the cross-sectional flow areas of the air plenums 530, 532 and the offsets of the set 520 of components 522 from one or more side ends of chassis 508 progressively change in discrete step-changes throughout the depth of the chassis interior 501.

Air plenum 530, as shown in FIG. 5, is an inlet air plenum 530 which is in flow communication with the inlet end 580 and is configured to receive cooling air 507 from an external environment via an inlet air vent 514 at the inlet end 580.

In some embodiments, one or more air plenums, air passages, etc. in a chassis interior is at least partially established based at least in part upon one or more baffle elements coupled to the chassis, where the baffle elements at least partially partition the chassis interior into separate regions. One or more baffle elements may be used, in combination with one or more sets of support structures coupled to the chassis, one or more sets of components installed in the chassis, etc. to establish various air plenums, air passages, etc.

In some embodiments, one or more air passages 540 are established in a gap 550 between adjacent components 522 installed in the chassis interior 501. Such air passages 540 can enable cooling air to flow from inlet air plenum 530 to exhaust air plenum 532 in heat transfer communication with the adjacent components 522. In some embodiments, a divider is located in the gap 550, where the divider at least partially restricts airflow between the adjacent components. As a result, separate air flows from plenum 530, through each of the separate passages 540A-E, can be restricted from mixing upstream of plenum 532 based at least in part upon dividers between the corresponding components 522. The dividers can align and support one or more components 522 in the chassis interior 501. One or more dividers can be coupled directly to the chassis. One or more dividers can be coupled to a support structure which is coupled to the chassis.

In some embodiments, a baffle element completes a partitioning of a chassis interior into separate air plenums, where the partitioning is at least partially established by a set of heat-producing components which extend through an interior portion of the chassis interior, by partitioning gaps at edge portions of the chassis interior between the set of components and one or more sides of the chassis. In the illustrated embodiment, for example, computer systems 500 includes baffle element 572 and baffle element 574 which collectively complete a partitioning of chassis interior 501 into separate air plenums 530, 532 and air passages 540A-E across a set 520 of components 522A-E. Baffle element 572 completes a partitioning of the chassis interior 501 proximate to the inlet end 580 by spanning a gap between the inlet-proximate component 522A and a side end of chassis 508, and baffle element 574 completes a partitioning of the chassis interior 501 proximate to the exhaust end by spanning a gap between the exhaust-proximate component 522E and another side end of chassis 508. Each baffle element at least partially partitions the respective gap across which it spans. As a result, cooling air 507 flowing through inlet air plenum 530, through air passages 540A-E, and through air plenum 532 as exhaust air 509 is at least partially restricted from bypassing the air passages 540, and thus heat removal from one or more of components 522A-E, by passing through either gap.

In some embodiments, a chassis includes an air vent flow control element configured to adjust the flow rate of cooling air into the chassis interior, based at least in part upon adjustment of a flow control element to adjust the flow area of an inlet air vent included in the chassis. In the illustrated embodiment, for example, chassis 508 includes a flow control element 582 which is configured to adjustably obscure portions of the inlet air vent 514 to adjust the cross-sectional flow area of the air vent 514. Adjustably obscuring portions of the inlet air vent 514 can include adjusting the position of the flow control element 582 relative to the vent 514. The flow control element 582 can be a sliding plate which can be slidingly adjusted, relative to the vent 514, to adjustably obscure portions of the inlet air vent 514.

In some embodiments, some or all of computer system 500 is included in one or more of the computer systems illustrated herein, including computer system 200, illustrated in FIG. 2.

Figure 6:
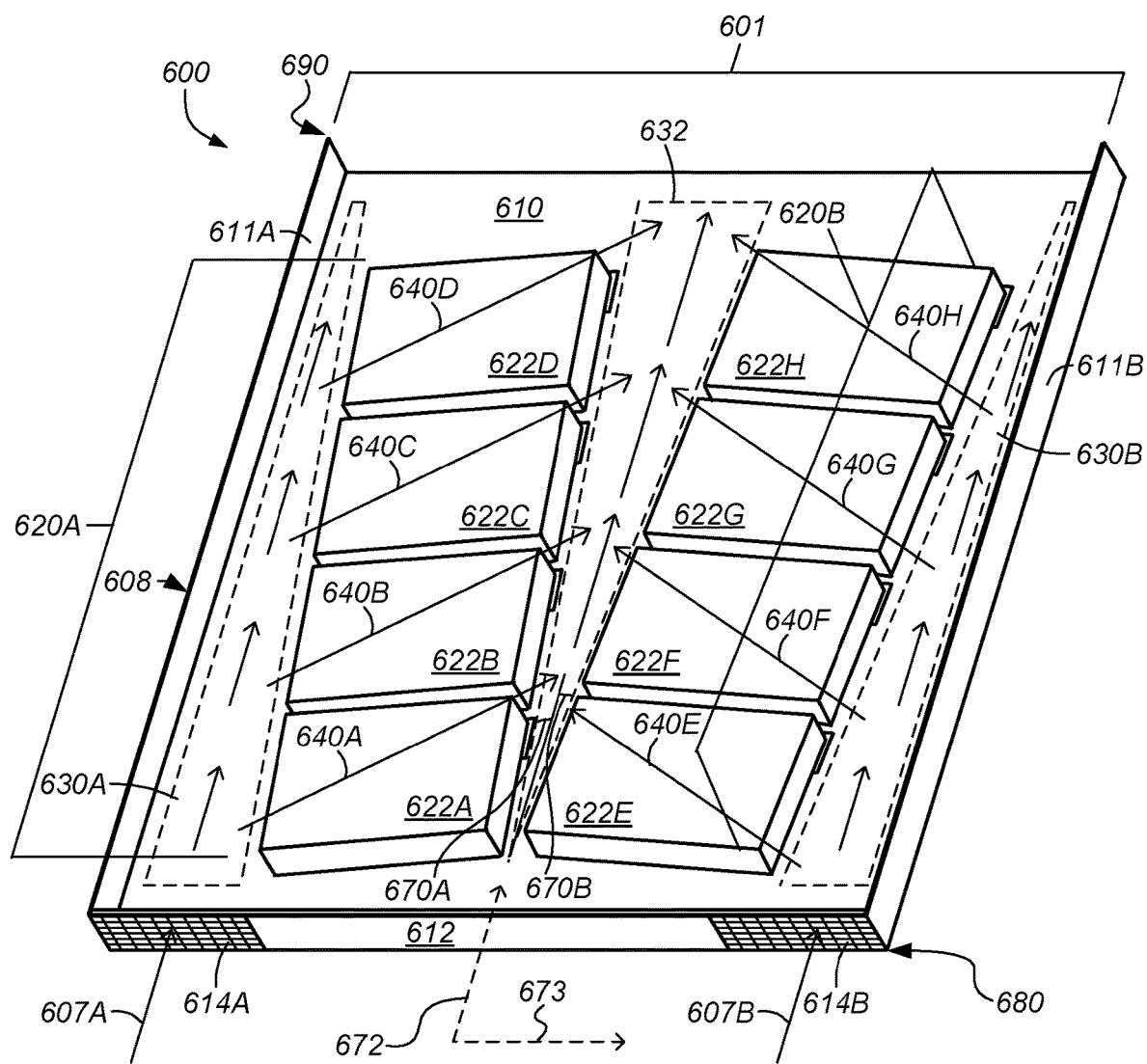
FIG. 6 is a schematic diagram illustrating a perspective view of a computer system that includes separate sets of heat-producing components, each arranged in an angled configuration to establish side inlet air plenums and a central exhaust air plenum, and air passages which direct separate portions of cooling air from a given inlet air plenum to flow in heat transfer communication with a separate portion of the components, according to some embodiments.

FIG. 6 is a schematic diagram illustrating a perspective view of a computer system that includes separate sets of heat-producing components, each arranged in an angled configuration to establish side inlet air plenums and a central exhaust air plenum, and air passages which direct separate portions of cooling air from a given inlet air plenum to flow in heat transfer communication with a separate portion of the components, according to some embodiments.

Computer system 600 includes a chassis 608, comprising a base element 610, side elements 611A-B, and inlet element 612, which at least partially encompass a chassis interior 601 in which multiple sets 620A-B of components 622A-H are installed in various separate arrangements to establish separate air plenums 630A-B and air passages 640A-D, 640E-H in the chassis interior 601. As shown, each separate air passage 640 directs a separate portion of cooling air flow 607A-B through a proximate inlet air plenum 630A-B to flow in heat transfer communication with a separate set of one or more components 622 of a given set 620A-B of components.

Each set 620A-B includes a configuration of components 622A-D or 622E-H which are arranged in varied offsets from the direction of the depth of the chassis interior 601, from the inlet end 680 to the exhaust end 690, throughout the depth of the chassis interior 601. The chassis interior 601 includes separate air plenums 630A-B, 632 and separate air passages 640A-D, 640E-H which enable air flow between separate air plenums to remove heat from various components 622A-H in the separate sets 620A-B. Components 622A-H can each include one or more heat-producing components. Components 622A-H can include one or more electronic components, including one or more mass storage devices, processors, etc. One or more of components 622A-H can include one or more hot-pluggable electronic components.

In the illustrated embodiment, air plenums 630A-B are inlet air plenums which are each in flow communication with separate inlet air vents 614A-B in the inlet element 612 at the inlet end 680 of the chassis 608. Separate cooling air flows 607A-B are received into the separate inlet air plenums 630A-B via the separate inlet air vents 614A-B. Each separate set 620A-B of components 622 includes multiple separate air passages 640 between a separate respective inlet air plenum 630 and the exhaust air plenum 632. In some embodiments, each separate air passage 640 directs a separate portion of cooling air 607A-B flowing through a proximate inlet air plenum 630A-B to flow in heat transfer communication with a separate component 622 to remove heat from that respective separate component and flow into air plenum 632. As a result, preheating of cooling air flows across each separate component 622 can be at least partially or fully mitigated. The various air passages 640 enable the various separate portions of cooling air 607A-B flowing through a respective inlet air plenum 630A-B to flow into a common exhaust air plenum 632 and pass out of the chassis interior 601, as exhaust air flow 609, via the exhaust end 690 of the chassis 608. The exhaust end 690, in some embodiments, is not encompassed by a portion of the chassis 608, as shown in the illustrated embodiment.

In some embodiments, each set of components in a chassis interior is arranged in a particular configuration which establishes a variable cross-sectional flow area of one or more air plenums in the chassis interior. For example, one or more sets of components 620A-B can each include an arrangement of components in an angled row configuration, where the respective row of components in the respective set 620A-B is angled, according to a respective angle 670A-B, relative to a first direction 672 through the chassis interior, where the first direction 672 can be the depth of the chassis interior. As a result, each set of components 620A-B extends through both a first direction 672 and an orthogonal second direction 673 through the chassis interior 601. In the illustrated embodiment of FIG. 6, each separate set 620A-B of components 622 is arranged in an angled row configuration, where component 622D in set 620A and component 622H in set 620B which are each proximate to exhaust end 290, are also each proximate to a separate side end 611A-B of the chassis 608, relative to component 622A in set 620A and component 622E in set 620B, which are each proximate to inlet end 280, are also each distal to the respective separate side end 611A-B of the chassis 608. In some embodiments, the angled row configuration of components 622 in one or more sets 620A-B of components at least partially establishes one or more air plenums which progressively decrease in flow area from the inlet end 680 towards the exhaust end 690, also referred to as narrowing of the air plenum, at least partially establishes an air plenum which progressively increases in flow area from the inlet end towards the exhaust end 690, also referred to as widening of the air plenum, etc.

In some embodiments, variable flow areas in an air plenum, throughout the depth of the chassis interior, can at least partially induce air flow through the separate air passages which are in flow communication with the respective air plenum. For example, where the flow area of the respective inlet air plenums 630A-B progressively narrows from the inlet end 680 toward the exhaust end 690, the flow direction of cooling air through the respective inlet air plenums 630A-B towards the exhaust end 690 is progressively impeded. In FIG. 6, the flow area through each of air plenums 630A-B, 632 changes continuously along the depth of the chassis interior 601 through which the sets 620A-B of components extend, based at least in part upon the angled row configuration of the sets of components. Such progressive impedance of air flow through an air plenum can be based at least in part upon one or more of the arrangement of components 622, support structures to which the components 622 are coupled, etc. which at least partially establish the boundaries of the air plenum. In some embodiments, including embodiments where the sets of components include components arranged in one or more staggered configurations, the flow area of one or more air plenums can vary by discrete step-changes in flow area through the depth of the chassis interior.

In some embodiments, some or all of computer system 600 is included in one or more of the computer systems illustrated herein, including computer system 200, illustrated in FIG. 2.

Figure 7:
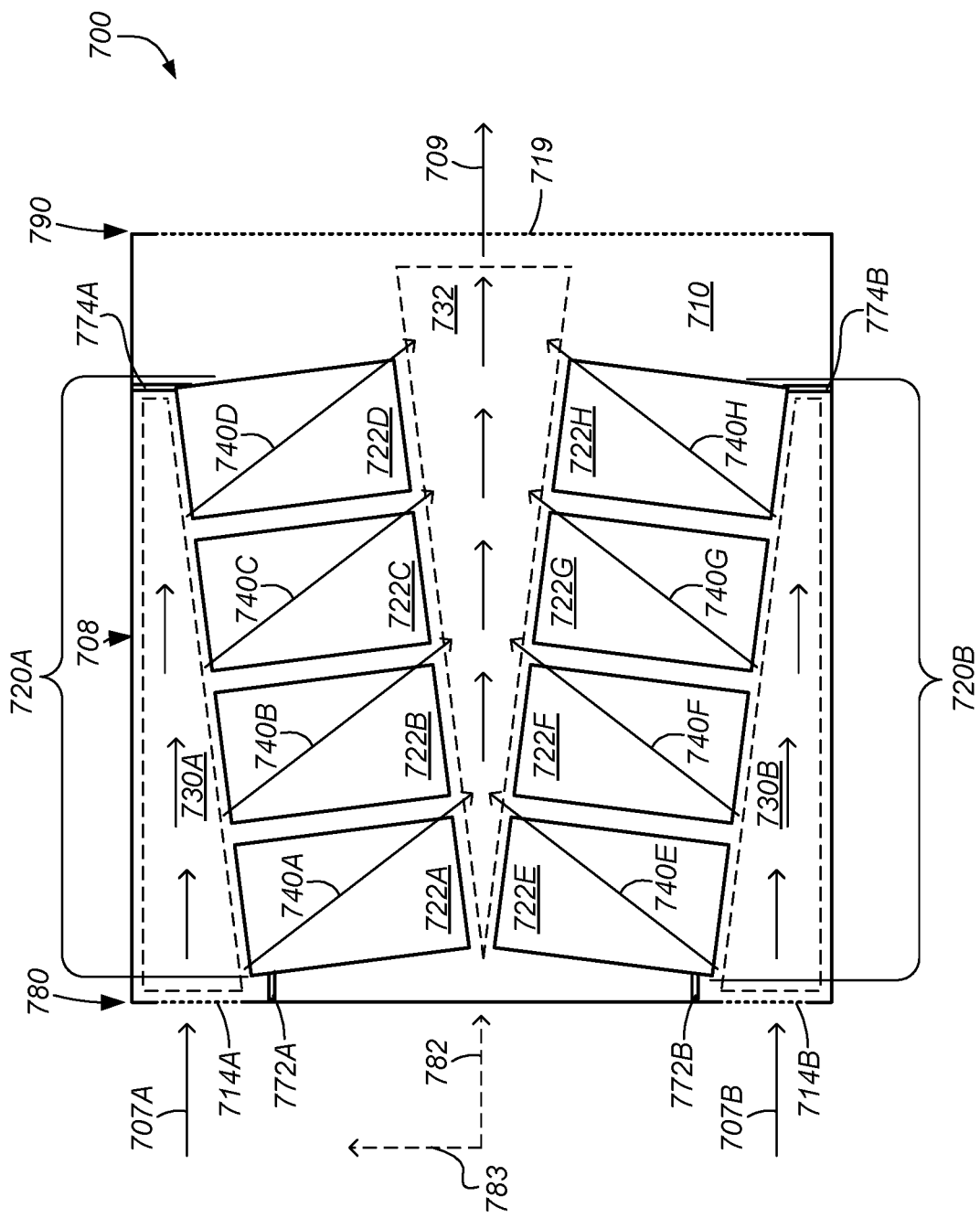
FIG. 7 is a schematic diagram illustrating a top view of a computer system that includes separate sets of heat-producing components, each arranged in an angled configuration, to establish side inlet air plenums and a central exhaust air plenum, and partitioned air passages which direct separate portions of cooling air from a given inlet air plenum to flow in heat transfer communication with a separate portion of the components, according to some embodiments.

FIG. 7 is a schematic diagram illustrating a top view of a computer system that includes separate sets of heat-producing components, each arranged in an angled configuration, to establish side inlet air plenums and a central exhaust air plenum, and partitioned air passages which direct separate portions of cooling air from a given inlet air plenum to flow in heat transfer communication with a separate portion of the components, according to some embodiments.

Computer system 700 includes separate sets 720A-B of components 722A-D, 722E-H mounted in the interior of chassis 708 in separate configures, which extend through both a first direction 782 and an orthogonal second direction 783 that both extend in parallel to the base element 710 of the chassis 708, and which establish separate air plenums 730A-B, 732 in the chassis interior and separate sets of air passages 740 across separate portions of the separate sets 720A-B of components. As shown, each separate air passage 740A-D, 740E-H directs a separate portion of one of cooling air flow 707A-B through a proximate inlet air plenum 730A-B to flow in heat transfer communication with a separate one or more components 722A-D, 722E-H of a particular set 720A-B of components. As referred to herein, an air passage which directs a portion of a cooling air flow to flow in heat transfer communication with a separate set of one or more components may be understood to be an air passage which "corresponds" to the one or more components. Similarly, the one or more components may be understood to "correspond" to the air passage. Such correspondence of an air passage and one or more components can be based at least in part upon the air passage directing a portion of an air flow to flow in heat transfer communication with the one or more components, independently of other components in the same set of components.

In some embodiments, an air passage corresponds to a particular component, so that the air passage directs a portion of air flow to remove heat exclusively from the corresponding particular component. For example, in the illustrated embodiment of FIG. 7, air passage 740A can correspond to component 722A, where passage 740A is configured to direct a portion of cooling air flow 707A from plenum 730A to flow, in parallel with base element 710 of chassis 708 and in heat transfer communication with component 722A, independently of components 722B-D. In some embodiments, each air passage is at least partially established by one or more portions of a support structure to which one or more components are coupled, one or more divider elements which establish mounting positions in the chassis 708 in which separate components 722 are installed, etc.

In some embodiments, where one or more air plenums progressively narrow from an inlet end towards an exhaust end of the chassis, the air plenums progressively impede an airflow through the air plenum from the inlet end towards the exhaust end. Airflow may be progressively impeded corresponding to changes in cross-sectional flow area of the air plenums. For example, where air plenums 730A-B progressively narrow from inlet end 780 towards exhaust end 790, the airflow 707A-B through each separate plenum 730A-B may become progressively more impeded, also referred to as being progressively impeded, as the cross sectional flow area of the respective plenum 730A-B decreases along its length in the first direction 782. Progressive impedance of flow through a plenum 730A-B at each change in cross sectional area can divert at least a portion of the airflow 707A-B in the respective plenum 730A-B to be supplied out of the plenum 730A-B into at least one air passage 740A-H extending in heat transfer communication with at least one component 722A-H mounted in the chassis 708, in parallel with base element 710. The increased impedance may create a pressure gradient that diverts air through passages 740 with reduced relative impedance relative to the plenum 730A-B at the point of increased impedance.

In some embodiments, where the progressive narrowing of one or more air plenums 730A-B is established based at least in part upon the angled row configuration of the components 722A-H in the respective sets 720A-B of components, the components may be coupled to the chassis 708 in an angled row configuration that establishes inlet air plenums 730A-B that each progressively narrow such that airflow 707A-B through the respective plenum 730 is progressively impeded along the depth of the chassis 708 in the direction of cooling air flow and maintains one or more airflow characteristics that exceed one or more predetermined threshold values of the flow characteristics.

In some embodiments, a computer system includes one or more baffle elements which span between one end of a set of components and a proximate end of the chassis to at least partially partition separate portions of the chassis interior into separate air plenums. As shown in FIG. 7, a given set 720 of components 722 extends through a depth of the chassis interior and through another dimension which is orthogonal to the depth of the chassis interior and can include one or more of a width or height of the chassis interior. Each set 720 of components 722 is separate from physical contact with any of the side ends, inlet end 780, exhaust end 790, etc. (i.e., "physically separate"). Baffle elements 772A-B, which each span between an inlet-proximate end of a separate set 720A-B and the inlet end 780 of the chassis 708, and baffle elements 774A-B, which each span between an exhaust-proximate end of a separate set 720A-B and a side end of the chassis 708, partition the portions of the chassis interior which are not partitioned by the sets 720A-B of components 722 into separate air plenums 730A-B, 732. Such partitioning precludes portions of the cooling air flows 707A-B into the respective inlet air plenums 730A-B via respective inlet air vents 714A-B from bypassing the components 722 and flowing directly into exhaust plenum 732 via gaps between the sets 720A-B and the ends of the chassis 708 at either the inlet end 780 or the exhaust end 790. As a result, an entirety of exhaust air 709, which can exit the chassis 708 via one or more exhaust vents 719 at exhaust end 790, has removed heat from one or more components 722 coupled to the chassis 708.

In some embodiments, some or all of computer system 700 is included in one or more of the computer systems illustrated herein, including computer system 200, illustrated in FIG. 2.

Figure 8A:
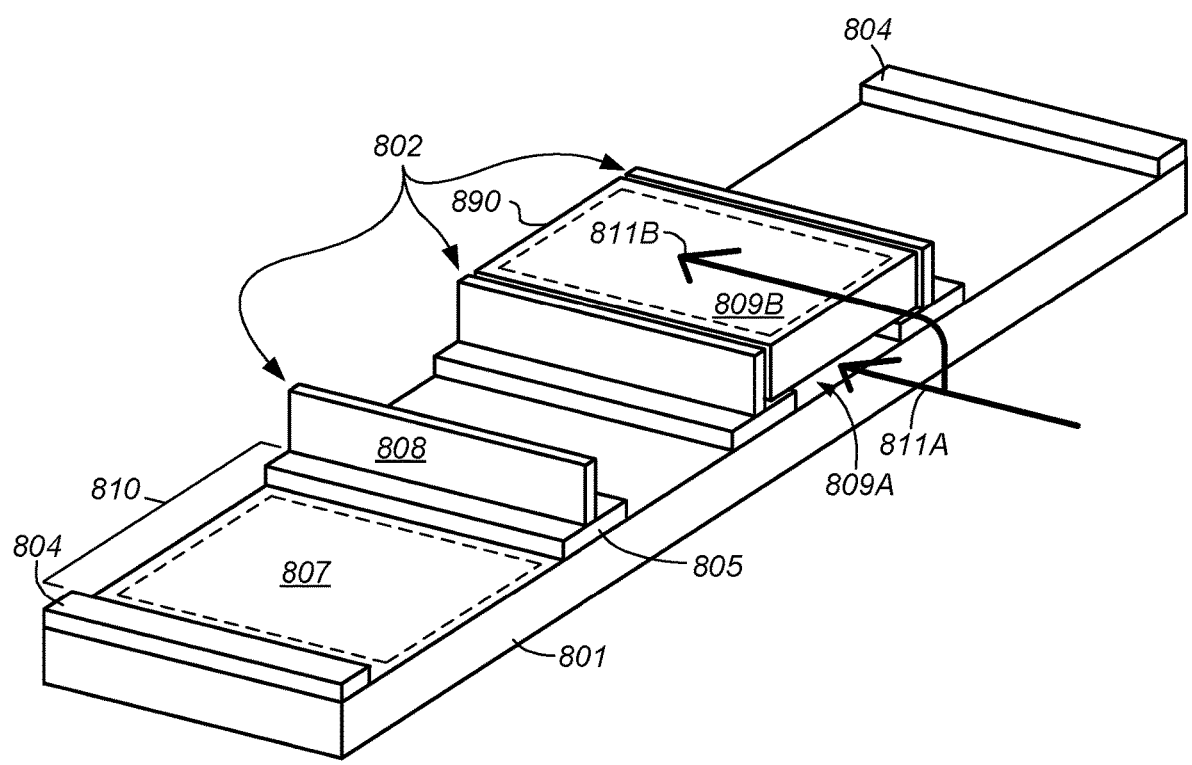
FIG. 8A is a schematic diagram illustrating a perspective view of a set of support structures to which a set of heat-producing components can be mounted to arrange the components in a particular configuration and at least partially establish one or more air passages and air plenums in a computer system interior, according to some embodiments.

FIG. 8A is a schematic diagram illustrating a perspective view of a set of support structures to which a set of heat-producing components can be mounted to arrange the components in a particular configuration and at least partially establish one or more air passages and air plenums in a computer system interior, according to some embodiments.

In some embodiments, a particular arrangement of components, including an arrangement of heat-producing components in a set of components, which is referred to interchangeably herein as a "configuration" of the components, is established based at least in part upon coupling the various components to particular portions of one or more support structures, where the support structures are configured to be coupled to by the various components at various locations to establish an arrangement of the components.

In the illustrated embodiment of FIG. 8A, a set of support structures 802, 804, when coupled to a base element 801 of a chassis, establish multiple slots 810 configured to accommodate separate heat-producing components in a particular arrangement. In the illustrated embodiment, the set of support structures 802, 804 are coupled to the base element 301 in a configuration which is configured to accommodate a set of components in a row configuration. It will be understood that, in some embodiments, one or more various configurations of components that are different from a row configuration may be established. For example, a set of support structures can be configured to arrange a set of components coupled to the backplane in a staggered configuration, which may be based at least in part upon a staggered configuration of slots, coupling elements, etc. included in the backplane structure.

Support structures 802, 804 collectively establish the various slots 810 in which one or more components 890 can be coupled. Base element 801 can be included in various base chassis illustrated and discussed herein, including base element 210 of chassis 208 illustrated in FIG. 2. Edge support structures 804, located at edge portions of the set of support structures, include coupling mounts to which one or more heat-producing components can be coupled via one or more various coupling systems. For example, each coupling mount can include one or more keyhole slots into which one or more structural elements can be inserted to couple a component 890 to the coupling mount. Central support structures 802, which are separate from the edge portions of the set, include coupling mounts 805 and dividers 808 coupled to the coupling mounts 805. As noted above, one or more heat-producing components can be coupled, via one or more various coupling systems, to each of the coupling mounts 805. For example, each coupling mount 805 can include a separate set of coupling points on opposite sides of the divider 808 of the respective support structure 802, so that separate components 890 can be coupled to the same support structure 802 on opposite sides of the divider 808. In some embodiments, the divider 808 includes one or more coupling elements configured to couple with one or more components 890 to couple the components in one or more slots 810.

As shown, a slot 810 is established based at least in part upon two or more support structures 802, 804 spanning at least a portion of the width of the base element 801 on opposite sides of a gap space 807. A slot can be established as a space between coupling elements on the separate support elements 802, 804 on opposite sides of a given gap space 807. The gap space, in some embodiments, establishes a portion of an air passage which is configured to direct a portion of an airflow along one side of the support structure 800 to flow to another side of the base element 801 through the respective slot 810 in which the gap space 807 is included, so that the directed portion of the air flow 811A-B passes in heat transfer communication with a component 890 coupled to the support structure 800 in the respective slot. In the illustrated embodiment, for example, a component 890, which can include one or more heat-producing components, is coupled to support structure 800 in one of the slots 810 established by two central support structures 802. The component 890 is coupled to separate coupling mounts 805 of the separate support structures 802. Because, in the illustrated embodiment, the coupling mounts 805 project away from the base element, coupling component 890 to the coupling mounts 805 of the opposite support structures 802 establishes a bottom air passage 809A that comprises the respective gap space 807 of the slot 810 and a lower surface of the component 890. The air passage 809A is configured to direct a bottom air flow 811A between the coupled component 890 and the base element 801. In addition, because the air passage 809A is bounded on all sides between the opposite sides of the support structure 800, the air flow 811A directed through the air passage 809A flows in heat transfer communication with component 890 independently of any component coupled to any other slot 810 of support structure 800, thereby at least partially mitigating preheating of air flow 811A by other components 890 which may be coupled in other slots 810.

In some embodiments, coupling a component 890 to one or more support structures 800 establishes multiple air passages which are in heat transfer communication with the component. In the illustrated embodiment, for example, in addition to the bottom air passage 809B established between a lower surface of coupled component 890 and the base element 801, coupling component 890 to support structures 802 establishes a top air passage 809B at least partially bounded by an upper surface of component 890. The air passage, in some embodiments, is bounded on a top end by a top end of a chassis interior in which the support structure 800 is coupled to a chassis. Such a top end can include a bottom end of another chassis, a lid structure of the chassis to which the support structure is coupled, etc. In some embodiments, top air passage 809 is at least partially unbounded on side ends. For example, divider elements 808 in each support element 802 may not extend above the upper surface of components 890. As a result, air flow 811B directed through air passage 809B may pass in heat transfer communication with components 890 coupled in adjacent slots 810.

In some embodiments, some or all of support structures 802, 804 are included in one or more of the computer systems illustrated herein, including computer system 200, illustrated in FIG. 2.

Figure 8B:
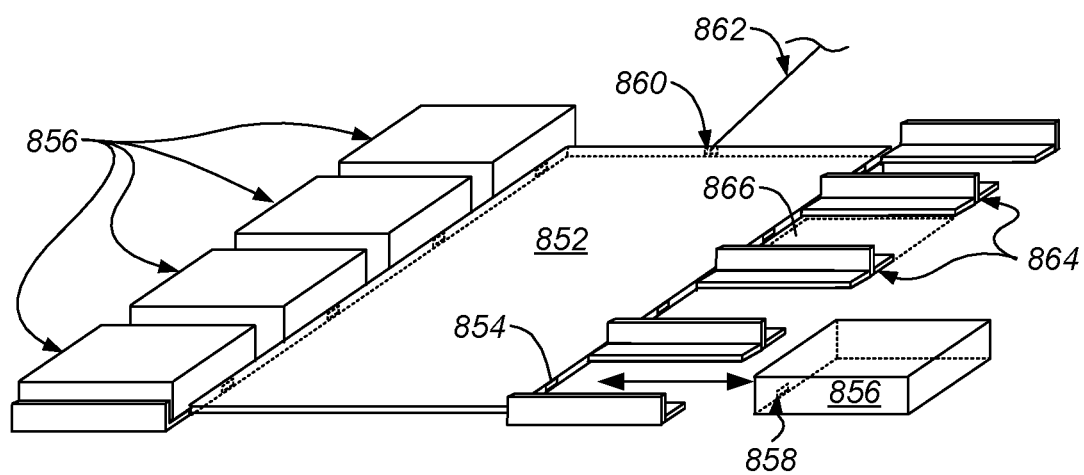
FIG. 8B is a schematic diagram illustrating a perspective view of a backplane support structure to which a set of heat-producing components can be mounted to arrange the components in a particular configuration and at least partially establish one or more air passages and air plenums in a computer system interior, according to some embodiments.

FIG. 8B is a schematic diagram illustrating a perspective view of a backplane support structure to which a set of heat-producing components can be mounted to arrange the components in a particular configuration and at least partially establish one or more air passages and air plenums in a computer system interior, according to some embodiments.

In some embodiments, a particular arrangement of components, including an arrangement of heat-producing components in a set of components, which is referred to interchangeably herein as a "configuration" of the components, is established based at least in part upon coupling the various components to particular portions of one or more backplane support structures, where the support structures are configured to be coupled to by the various components at various locations to establish an arrangement of the components and to couple the components to one or more power sources, external systems, etc.

In the illustrated embodiment of FIG. 8B, a backplane 852 can be coupled to one or more portions of a chassis. A backplane can be coupled to a chassis in a portion of the chassis interior which includes an air plenum. For example, the illustrated backplane 852 can be coupled to the base element 417 of the chassis 408 illustrated in FIG. 4, in a portion of the chassis interior 401 which includes plenum 432. As a result, the backplane 852 can be coupled to the chassis 408 so that the components 422 coupled to the chassis are arranged to face respective interfaces 472 towards the backplane 852.

As shown, backplane 852 includes backplane interfaces 854 on opposite sides of the backplane. Components 856 can be coupled to separate backplane interfaces 854 via component interfaces 858. As shown, the components 856 can be horizontally translated to and from a given interface 854 of the backplane to couple the component 856 to the backplane interface 854.

In some embodiments, each interface 854 in a backplane 852 is coupled to one or more backplane interfaces 860 which are communicatively coupled, via one or more pathways 862, to one or more external systems, services, etc. In some embodiments, pathway 862 includes a power transmission line which electrically couples interface 860 with an external power supply. In some embodiments, pathway 862 includes a communication cabling configured to communicatively couple interface 860 with an external system, including a remote instance of processor circuitry. Interface 860 can be communicatively coupled, electrically coupled, etc. to each of the interfaces 854 in the backplane 852, so that coupling a component 856 with an interface 854 couples the component to the external service, system, etc. to which interface 860 is coupled via pathway 862.

In some embodiments, components 856 are coupled to a backplane 852 based at least in part upon coupling the components with one or more support structures 864. Support structures can structurally support the components, physically secure the components in a position to couple component interfaces 858 with backplane interfaces 854, align components 856 to align the respective interfaces 856, 854, etc. In the illustrated embodiments, the support structures 864 include a set of structures to which a component 856 can be physically coupled, e.g., via keyhole slot connections, to physically secure a component in a position where interface 858 of the component 856 is connected with a corresponding interface 854 of the backplane 852. As shown, each support structure 864 establishes at least a portion of a boundary of a slot 866 associated with a given backplane interface 854. A component 856 can be inserted in a given slot 866 and coupled, aligned, guided, etc. by the support structures 864 bounding a slot 866 to enable an interface 858 of the component 856 to be coupled with an interface 854 corresponding to the given slot 866.

Various types of support structures can be used to couple a component with a backplane interface. In some embodiments, a support structure includes connectors which connect with a component interface 858 to couple the component with a backplane interface 854. For example, a support structure can include a device carrier, including a drive carrier structure, which can structurally support, align, and secure a component 856 in a housing interior. The device carrier can include various securing components to secure the component in the housing interior in a particular position. In some embodiments, the device carrier includes a set of external connectors coupled to a backplane interface 854, and a set of internal connectors, coupled to the external connectors, which are configured to couple with an interface 858 of a component 856 secured in the device carrier housing interior. The internal connectors can include blind-mate connectors, so that a component, when inserted into the housing interior, and secured therein, is coupled to one or more external systems, services, etc. via the internal connectors, external connectors, interface 854, interface 860, pathway 862, etc. In some embodiments, a device carrier can be coupled to a portion of the chassis to which the backplane 852 is coupled, including a base element of the chassis. The carrier device can include one or more air passages configured to direct airflow between separate air plenums in a chassis interior.

The illustrated embodiment shows a horizontally-oriented backplane 852. The backplane can be configured to direct airflow across one or more components into an air plenum in a chassis interior. In some embodiments, the backplane 852 includes one or more air passages configured to direct airflow exiting an air passage across one or more components into one or more air plenums. For example, where backplane 852 is coupled to base element 710 of the chassis 708 illustrated in FIG. 7, in a portion of base element 710 included in plenum 732, the backplane 852 can be configured to direct airflow exiting each of the air passages 740A-H to flow into plenum 732 and out of the chassis 708 via exhaust end 790. In some embodiments, backplane 852 is vertically-oriented, and multiple vertically-arranged sets of components can be coupled to a given vertically-oriented side of the backplane. For example, such a side of the backplane can include two horizontally-arranged sets of backplane interfaces 854, where one set of interfaces 854 is arranged above the other set, so that two sets of components can be coupled to the same side of the backplane, where one set is coupled to the backplane above the other set. Such a backplane can include multiple air portals in the side of the backplane to enable air flow exiting one or more air passages across one or more of the components to pass through the backplane into an air plenum.

In the illustrated embodiment, backplane 852 is configured to arrange two sets of components 856 coupled thereto in separate row arrangements which extend in parallel through a chassis interior in which the backplane 852 is coupled. It will be understood that the backplane can be configured to arrange coupled components 856 in various configurations, arrangements, etc. Such arrangements, configurations, etc. can include various component configurations illustrated in FIG. 1-9. For example, in some embodiments, the backplane 852 is configured to include a triangular shape, where opposite sides of the backplane which include interfaces 854 meet at a vertex, so that the components coupled to the opposite sides are arranged in separate row configurations which extend at an angle from a first dimension. Such a backplane 852 can be coupled to the chassis 708 illustrated in FIG. 7, so that components 722A-D are coupled to one side of the backplane 852 and components 722E-H are coupled to another opposite side of the backplane, and the separate sets 720A-B of components are arranged in row configurations which are angled from the figures dimension 782, as shown in FIG. 7. In another example, in some embodiments, the backplane 852 is configured to include a staggered shape, where opposite sides of the backplane which include interfaces 854 are staggered through a second dimension as the respective sides extend through a first dimension, so that the components coupled to the opposite sides are arranged in separate staggered configurations. Such a backplane 852 can be coupled to the chassis 308 illustrated in FIG. 3, so that components 322A-F are coupled to one side of the backplane 852 and components 322G-L are coupled to another opposite side of the backplane, and the separate sets 320A-B of components are arranged in staggered configurations as shown in FIG. 3.

In some embodiments, some or all of backplane 852 is included in one or more of the computer systems illustrated herein, including computer system 200, illustrated in FIG. 2.

Figure 9:
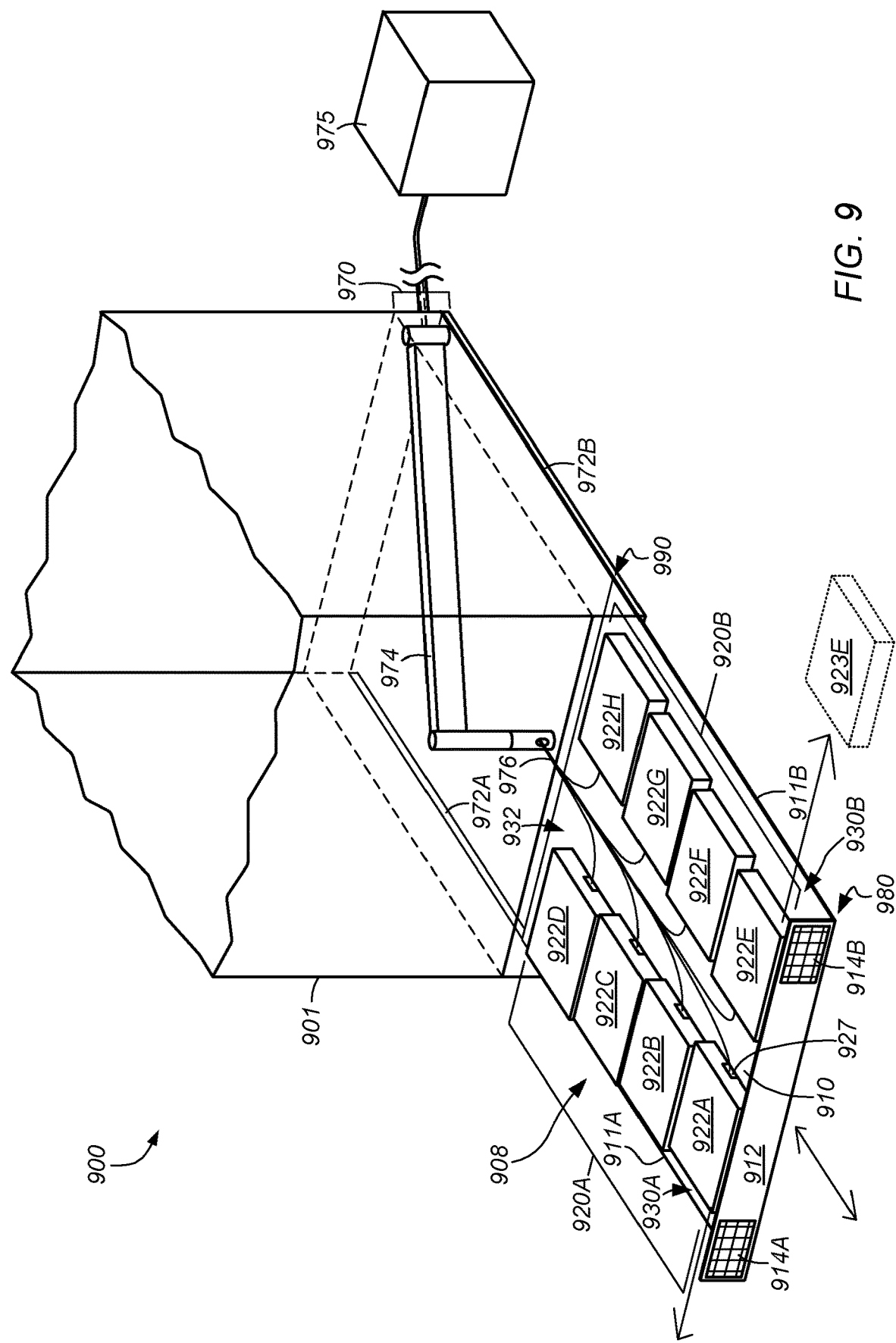
FIG. 9 is a schematic diagram illustrating a perspective view of a computer system that is configured to translate out of a mounted rack to enable hot-swapping of hot-pluggable heat-producing component mounted in staggered configurations throughout the depth of the computer system interior, according to some embodiments.

FIG. 9 is a schematic diagram illustrating a perspective view of a computer system that is configured to translate out of a mounted rack to enable hot-swapping of hot-pluggable heat-producing component mounted in staggered configurations throughout the depth of the computer system interior, according to some embodiments.

In some embodiments, a computer system which includes multiple sets of components coupled to the chassis in particular arrangements to establish various air plenums and air passages in the chassis interior includes hot-pluggable electronic components in one or more of the sets of components. The hot-pluggable electronic components can be coupled to the chassis in configurations that extend through the depth of the chassis between inlet and exhaust ends of the chassis. Such configurations may be physically separate from one or more of the inlet, exhaust, and side ends of the chassis. As a result, the hot-pluggable electronic components in one or more sets of components may be located entirely within the chassis interior. Access to hot-pluggable electronic components, for example to implement hot-swapping of one or more components, can be enabled through translating the chassis along one or more dimensions to at least partially translate the chassis out of a rack in which the chassis is mounted. Such translation of the chassis can at least partially expose the chassis interior, including one or more hot-pluggable electronic components installed in the interior, to an external environment. In some embodiments, the established air plenums in the chassis interior enable cable management of various cabling used to maintain operations of hot-pluggable components while the chassis is being translated in various dimensions and to provide maneuvering space to enable maneuvering of one or more hot-pluggable electronic components to implement hot-swapping operations.

System 900 includes a rack 901 which itself includes a slot 970 into which a chassis 908 is mounted. The chassis 908 can be mounted in the slot 970 via slidingly engaging with one or more rail support elements 972A-B on opposite sides of the slot 970, so that the chassis 908 can be slidingly translated in and out of the slot 970 via at least an front end of the slot on the front end of rack 901, and support elements 972A-B can structurally support the chassis 908 in the slot 970. The chassis 908 includes a base element 910 and inlet element 912, where the inlet element 912 includes inlet air vents 914A-B. The side ends 911A-B of the chassis are at least partially unencompassed, so that the chassis interior of chassis 908 is at least partially exposed via the side ends 911A-B, as shown, when the chassis 908 is at least partially removed from slot 970.

Components 922A-H are coupled to the base element 910 of chassis 908 in separate sets 920A-B which are arranged in particular configurations in the chassis interior to establish at least separate air plenums 930A-B, 932 in the chassis interior. In the illustrated embodiment, one or more of components 922A-H include one or more hot-pluggable electronic components. Each component 922A-H is configured to be coupled to an external system 975, which can include an external computer system, one or more instances of processor circuitry, etc. which is external to chassis 908. External system 975, in some embodiments, is mounted in rack 901. Each component 922 is coupled to an external system 975 via one or more separate instances of cabling 976. The components 922A-H are each coupled to the chassis 908 in one or more arrangements which position one or more cabling interfaces 927 of each component 922 to face the established air plenum 932, which can be an exhaust air plenum. As a result, the chassis is configured to route the various instances of cabling 976 to the various components 922 through the established air plenum 932. In some embodiments, the various components 922 are coupled to the chassis 908 in one or more arrangements which position one or more cabling interfaces of the components 922 to face into an air plenum which is in flow communication with one or more particular ends of the chassis. For example, as shown in FIG. 9, the components 922 are positioned to face respective interfaces 927 of the components 922 into plenum 932, where plenum 932 is in flow communication with the exhaust end 990 of the chassis 908, and where a cable management arm 974 coupled to the rack 901 enables the cabling 976 to be routed through the exhaust end 990. The cable management arm 974 is configured to manage the motion of cabling 976 when chassis 908 is translated in various directions, including out of the rack 901 via the inlet end 980. As a result, when chassis 908 is translated at least partially into and out of slot 970, the various components 922 can remain on-line and communicatively coupled to at least external system 975 via cabling 976.

As shown in FIG. 9, coupling multiple sets 920A-B of components 922 to chassis 908, in particular configurations which establish various air plenums 930A-B, 932 in the chassis interior, can establish spaces which enable hot-swapping of hot-pluggable devices which are installed within the chassis interior and separate from one or more of the end of the chassis. The various components 922 are coupled to the base element 910 of chassis 908 in two separate configurations which do not extend to any of the inlet end 980 or exhaust end 990; access to such components 922 is facilitated through translating the chassis 908 at least partially out of the rack 901. As shown, such translation of the chassis 908 can at least partially expose the chassis interior at least partially encompassed by inlet element 912 and base element 910 of chassis 908, thereby at least partially exposing the components 922 coupled to the chassis 908. One or more of the components 922, including one or more hot-pluggable electronic components, can be added, removed, swapped, etc. from the chassis interior via maneuvering the components through one or more of the established air plenums in the chassis interior. As shown, components 922A and 922E can be removed via the unencompassed respective side ends 911A-B of the chassis 908. Such removal can include translating each components 922A, E through a respective proximate air plenum 930A-B. Such translation can be in parallel with the base element 910 to which the one or more components 922 are coupled, directly, via coupling with one or more support structures coupled to the base element 910, etc. As shown in the illustrated embodiment, a component 922E can be removed from chassis 908, as shown by element 923E, via translation of component 922E in parallel with base element 910 and through air plenum 930B to be removed from chassis 908 via side end 911B. In some embodiments, one or more components 922, 923, etc. can be removed, added to the chassis 908 via vertical translation to or from the chassis, horizontal translation to or from the chassis, angling from the base element and translation to or from the chassis, some combination thereof, etc. In some embodiments, including where the support structure to which a given component 922 is coupled to couple the component 922 to the chassis 908 comprises a carrier structure, including a drive carrier, the component can be accessed via translating the chassis 908 at least partially out of the slot 970 to expose a portion of the unencompassed side ends 911A-B and accessing the component coupled to the carrier structure via one of the exposed unencompassed side ends 911A-B.

In some embodiments, some or all of system 900 is included in one or more of the computer systems illustrated herein, including computer system 200, illustrated in FIG. 2. In some embodiments, some or all of computer systems illustrated herein, including computer system 200, illustrated in FIG. 2, are included in system 900.

Figure 10:
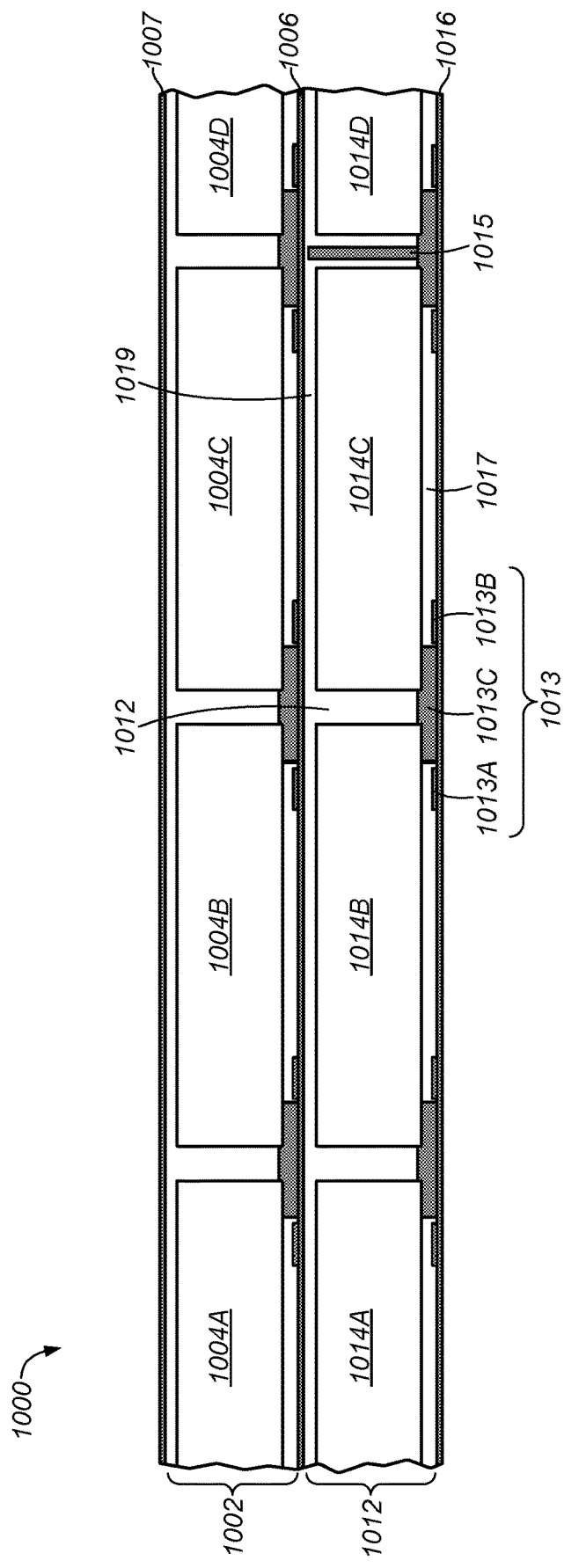
FIG. 10 is a schematic diagram illustrating a side view of a computer system including multiple chassis, where each chassis includes a separate set of heat-producing components mounted on various support structures to establish air passages between separate air plenums in the respective chassis interior, according to some embodiments.

FIG. 10 is a schematic diagram illustrating a side view of computer system including multiple chassis, where each chassis includes a separate set of heat-producing components mounted on various support structures to establish air passages between separate air plenums in the respective chassis interior, according to some embodiments.

System 1000 includes two separate chassis 1002, 1012 stacked vertically relative to each other, where each chassis includes a separate set of components 1004A-D, 1014A-D coupled to a base element 1006, 1016 of the respective chassis. One or more of the components 1004, 1014 can include one or more electronic components. One or more of the components 1004, 1014 can include a carrier structure into which one or more electronic components can be mounted to couple the electronic components to a chassis. For example, a carrier structure can include a drive carrier configured to accommodate a hard disk drive. One or more of the components 1004, 1014 can include one or more heat-producing components, electronic components, hot-pluggable electronic components, etc.

In some embodiments, a chassis can include one or more sets of support structures to which one or more components can be coupled to couple the components to a chassis. In addition, some embodiments of one or more support structures at least partially establish one or more air passages through the interior of the chassis, where the air passages are configured to flow in heat transfer communication with one or more components coupled to the respective chassis. In the illustrated embodiment of FIG. 10, for example, each chassis 1002, 1012 includes a respective set of support structures 1013 which are coupled to the respective base element 1006, 1016 of the respective chassis 1002, 1016. The set of support structures 1013 can be coupled to a chassis in a particular configuration which corresponds to a particular configuration of components, so that coupling a set of components to the set of support structures results in the particular configuration of components. As shown, each of the support structures 1013 in the separate chassis 1002, 1012 are coupled to the respective chassis in a configuration which spaces the various support structures apart, so that coupling a set of components 1004, 1014 to the respective set of support structures 1013 arranges the respective set of components in a particular configuration in the chassis interior.

In some embodiments, one or more supports structures are configured to at least partially establish one or more air passages which are in heat transfer communication with one or more various components coupled to the chassis. In the illustrated embodiment, each support structure 1013 includes base elements 1013A-B and a coupling mount 1013 which at least partially establish one or more air passages in the respective chassis. The base elements 1013A-B can include coupling elements which couple a support structure 1013 to a base element 1006, 1016 of a chassis 1002, 1012, and the coupling mount 1013C can include one or more coupling elements configured to couple with one or more components 1004, 1014 to couple the components to the respective chassis. As shown, the coupling mount 1013C can project away from the respective base element 1006, 1016 to which the base elements 1013A-B of the support structures are coupled. As a result, the support structure is configured to couple one or more components 1004, 1014 in an elevated position within a chassis 1002, 1012, so that a bottom air passage 1017 is established between a coupled component, base element, and support structures coupling the component to the chassis base element. For example, in the illustrated embodiment, bottom air passage 1017 is established by a lower surface of component 1014C, an upper surface of base element 1016, and the coupling mounts 1013C of the separate support structures 1013 to which the component 1014C is coupled to couple the component 1014C to chassis 1012. Air passage 1017, being bounded by a single component coupled to a chassis, can be in heat transfer communication with the single component 1014C, independently of the other components coupled to the same chassis 1012 in which the air passage is located. As a result, air directed through the bottom air passage 1017 can remove heat from the coupled component 1014C independently of the other coupled components 1014A-B, 1014D.

Each support structure 1013 can establish an air passage 1012 in a gap between adjacently-coupled components 1004, 1014, so that the air passage 1012 directs an air flow to flow in heat transfer communication with both adjacent components, in parallel with the respective base elements 1006, 1016 of the respective chassis 1002, 1012. In some embodiments, a divider 1015 is coupled to one or more of the components 1004, 1014, support structures 1013, etc. The divider 1015 can restrict airflow through the gap 1012, thereby at least partially restricting an air flow from flowing in heat transfer communication with multiple adjacent components. For example, divider 1015 can preclude an air flow from flowing between components 1014C and 1014D to remove heat from both components. In some embodiments, a divider 1015 is configured to at least partially align one or more components coupled to a chassis. In some embodiments, divider 1015 is coupled to a lid structure 1007 of a chassis 1002, independently of one or more support structures, components, etc.

In some embodiments, a chassis is configured to establish one or more top air passages over one or more components coupled to the respective chassis. Top air passages may be bounded on a bottom end by an upper surface of one or more components coupled to the chassis, and may be bounded on a top end by one or more various surfaces which bound the top end of the chassis interior. For example, top air passage 1019 is bounded by an upper surface of component 1014C and a lower surface of a base element 1006 of chassis 1002 which is stacked above chassis 1012, and top air passage 1019B is bounded by an upper surface of component 1004C and a lower surface of lid structure 1007 of chassis 1002. As shown, some air passages through a chassis are unencompassed on one or more sides, so that air flow directed through the air passages can mix with air passing through other passages. For example, in the illustrated embodiment of FIG. 10, each top air passage 1019 above each coupled component 1004, 1014 is unencompassed on side ends, so that air passing through each top air passage 1019 can mix with air passing through one or more other air passages 1019, 1012, etc. In some embodiments. As a result, preheating of air passing through one or more air passages in one or more of the chassis 1002, 1012 may occur. In some embodiments, one or more air passages may be at least partially encompassed, at one or more side ends, by one or more divider structures 1015, to at least partially mitigate mixing of air flows between separate air passages.

In some embodiments, some or all of computer system 1000 is included in one or more of the computer systems illustrated herein, including computer system 200, illustrated in FIG. 2.

Figure 11:
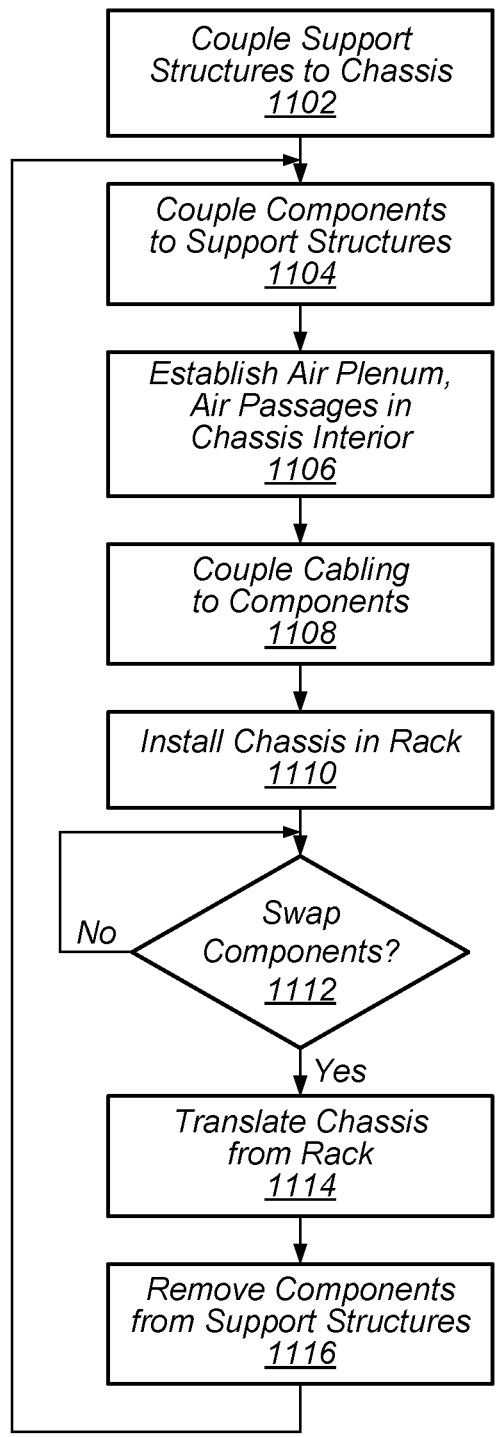
FIG. 11 illustrates a method of providing a computer system with heat-producing components arranged to establish separate air plenums and air passages in the computer system interior and to enable hot-swapping of components in the interior, according to some embodiments.

FIG. 11 illustrates a method of providing a computer system with heat-producing components arranged to establish separate air plenums and air passages in the computer system interior and to enable hot-swapping of components in the interior, according to some embodiments. The illustrated method can be implemented with regard to one or more of the computer systems illustrated herein, including computer system 200 illustrated in FIG. 2.

At 1102, one or more sets of support structures are coupled to a chassis. The chassis can include one or more elements, including one or more base elements, inlet elements, side elements, exhaust plates, etc. The one or more sets of support structures can be coupled to one or more of the elements comprising the chassis. The support structures are coupled to the chassis in one or more various arrangements to configure the support structures to couple one or more sets of components in the chassis interior in one or more particular arrangements (also referred to herein as "configurations") to establish various air plenums, and air passages there between, in the chassis interior. In some embodiments, one or more of the sets of support structures comprise a backplane structure configured to couple to one or more sets of components in a particular arrangement. In some embodiments, one or more of the sets of support structures comprise multiple support structures which are coupled to the chassis in a particular arrangement corresponding to a particular arrangement of heat-producing components.

At 1104, one or more sets of components are coupled to the one or more sets of support structures to couple the one or more sets of components to the chassis in the chassis interior. The components can include one or more electronic components, one or more carrier devices configured to accommodate one or more electronic devices, one or more heat-generating components, some combination thereof, etc. For example, one or more of the components can comprise one or more hard disk drives, solid state drives, one or more drive carrier devices, etc. One or more of the components can be hot-pluggable.

Coupling one or more sets of components to the one or more sets of support structures can include coupling the one or more sets of components in one or more particular arrangements in the chassis interior. For example, a set of components can be coupled to a set of support structures so that the components are arranged in a particular configuration which extends at least partially through first and second dimensions of the chassis interior, and in parallel with the base element of the chassis. The first and second dimensions can be orthogonal to each other. The first and second dimensions can each be a separate one of the depth, width, or height of the chassis interior. In some embodiments, a particular configuration of a set of components comprises a staggered configuration of components which extends through the depth of the chassis interior and in a progressive offset from one or more side ends of the chassis throughout the chassis interior.

At 1106, one or more air plenums and air passages are established in the chassis interior. The various air plenums and air passages may be at least partially established by the one or more sets of components coupled to the chassis in the chassis interior. For example, a set of components, and a corresponding set of support structures to which the set of components are coupled, may establish one or more boundaries of one or more air plenums in the chassis interior, and one or more sets of air passages which correspond to the components and are configured to direct separate portions of airflow from one air plenum to another, in heat transfer communication with at least partially separate portions of the set of components. In some embodiments, the set of components and corresponding set of support structures partially establish the various plenums and air passages, and one or more sets of baffle elements are coupled to one or more of the chassis, components, support structures, etc. to complete the establishment of same.

At 1108, one or more instances of cabling are coupled to the one or more components coupled to the chassis. The cabling can include one or more instances of power cabling, communication cabling, etc. Communication cabling can include various instances of well-known communication cabling, including network cabling, USB cabling, etc. In some embodiments, separate instances of cabling are coupled to each separate component of a set of components coupled to the chassis. For example, where one or more components coupled to the chassis are hot-pluggable electronic components, a separate instance of communication cabling may be coupled to each of the separate components. The various instances of cabling can be routed to the various components in the chassis via one or more of the established air plenums in the chassis interior. For example, where a chassis is configured to be mounted in a rack, where cabling is routed between the various components in the rack and one or more external systems, services, etc. via an exhaust side of the rack, the various instances of cabling coupled to the one or more sets of components coupled to a chassis can be routed through one or more air plenums, in the chassis interior, which are in flow communication with the exhaust end of the chassis, so that the cabling can be routed between the components and one or more systems that are external to the chassis via the one or more air plenums. In some embodiments, the various instances of cabling are coupled to a cable management arm that is proximate to the end of the chassis through which the cabling is routed.

At 1110, the chassis is installed in a rack. The rack can include one or more shelf modules, which can include one or more slots into which the chassis can be mounted to install the chassis in the rack. A slot can include one or more support elements, including one or more guide rails, which provide structural support and alignment to a chassis mounted in the slot. A chassis can be translated into and out of the slot via sliding engagement of a portion of the chassis, including a lower surface of a base element of the chassis, one or more pairs of rail supports coupled to the chassis, etc., with the various support elements in the slot.

At 1112, a determination is made regarding whether to swap one or more components coupled to the chassis. In some embodiments, where a chassis includes one or more hot-pluggable electronic components coupled to the chassis and communicatively coupled with one or more remote systems, services, etc., including one or more remote instances of processor circuitry, the determination includes a determination whether to hot-swap one or more of the hot-pluggable electronic components. If so, at 1114, the chassis is translated in one or more directions to at least partially remove the chassis from the rack slot in which it is mounted. Such translation can include sliding the chassis out of an end of the rack, including an inlet end of the rack, and can at least partially expose the chassis interior that is separate from an end of the chassis to an external environment that is external to the rack. Where the chassis includes components which are coupled to the chassis in the chassis interior, and physically separate from the ends of the chassis, translating the chassis can expose these components to the external environment. At 1116, the one or more components are removed from one or more support structures to which the components are coupled. Such removal can include removing one or more components, including one or more hot-pluggable components, from one or more carrier structures in which the respective components are mounted in the chassis interior. Such removal can include decoupling the one or more components from one or more instances of cabling. Such removal can include translating the one or more components through one or more air plenums of the chassis interior to maneuver the components out of the chassis. For example, where a chassis includes inlet air plenums extending through a depth of the chassis interior, each between a separate set of components and a side end of the chassis that is unencompassed by side elements of the chassis, translation of the chassis from the rack can at least partially expose the air plenum to the external environment via the unencompassed side end, and a component can be removed from the chassis interior via translating the component through the respective inlet air plenum and out of the chassis interior via the unencompassed and exposed side end of the chassis. Conversely, one or more components can be coupled to the chassis via maneuvering the component into a position to be coupled to one or more support structures, via an unencompassed and exposed side end of the chassis and a proximate air plenum between the unencompassed side end and the respective one or more support structures.

The various methods as illustrated in the Figures and described herein represent example embodiments of methods. The methods may be implemented in software, hardware, or a combination thereof. The order of method may be changed, and various elements may be added, reordered, combined, omitted, modified, etc.

Although the embodiments above have been described in considerable detail, numerous variations and modifications will become apparent to those skilled in the art once the above disclosure is fully appreciated. It is intended that the following claims be interpreted to embrace all such variations and modifications.

What is claimed is:

1. A system, comprising:
   a rack comprising one or more rack slots; and
   one or more data storage modules mounted in the rack via the one or more rack slots, at least one of the data storage modules comprising:
      a chassis comprising:
         a front side;
         a rear side opposite the front side;
         a top side;
         a bottom side opposite the top side; and
         opposing lateral sides; and
      hot-pluggable mass storage devices within an interior of the chassis; and
      a plurality of support structures coupled to the chassis and configured to couple the hot-pluggable mass storage devices in an arrangement that at least partially establishes a progressively narrowing air plenum;

wherein the chassis is configured to:
translate at least partially out of the one or more rack slots to expose the lateral sides; and
enable hot-swapping of at least one of the hot-pluggable mass storage devices via an exposed one of the lateral sides of the chassis while maintaining operation of at least another one of the hot-pluggable mass storage devices.

2. The system of claim 1, wherein:
each hot-pluggable mass storage device of the hot-pluggable mass storage devices is configured to communicatively couple with a remote instance of processor circuitry via a separate one of a plurality of communication cables extending through the chassis via an exhaust portion of the rear side; and
the system further comprises a cable management arm coupled to the rack and configured to accommodate movement of the plurality of communication cables such that communicative coupling of each hot-pluggable mass storage device with the remote instance of processor circuitry is maintained when the chassis is translated at least partially out of the one or more rack slots to expose the lateral sides.

3. The system of claim 2, wherein:
each hot-pluggable mass storage device of the hot-pluggable mass storage devices includes one or more cabling interfaces facing an exhaust air plenum that is in air flow communication with the exhaust portion; and
the plurality of communication cables are routed between the one or more cabling interfaces and the cable management arm through the exhaust portion.

4. The system of claim 1, wherein:
the hot-pluggable mass storage devices include at least two sets of hot-pluggable mass storage devices;
each set of the at least two sets of hot-pluggable mass storage devices extends at least partially through both a depth of the interior of the chassis and opposite directions through a width of the interior of the chassis; and
the at least one of the data storage modules is configured to direct cooling air from an intake portion of the front side to an exhaust portion of the rear side;
the at least one of the data storage modules further includes:
an exhaust air plenum that is bounded at least in part by the at least two sets of hot-pluggable mass storage devices; and
air passages that are individually configured to direct a separate portion of the cooling air across at least a portion of a respective hot-pluggable mass storage device of the at least two sets of hot-pluggable mass storage devices and into the exhaust air plenum to remove heat from the respective hot-pluggable mass storage device.

5. The system of claim 4, wherein each set of the at least two sets of hot-pluggable mass storage devices extends in a staggered configuration through an interior of the chassis.

6. A rack-mountable module, comprising:
a chassis, comprising:
a front side;
a rear side opposite the front side;
a top side;
a bottom side opposite the top side; and
opposing lateral sides; and
hot-pluggable electronic components located within an interior of the chassis; and
a plurality of support structures coupled to the chassis and configured to couple the hot-pluggable electronic components in an arrangement that at least partially establishes a progressively narrowing air plenum,
wherein the chassis is configured to:
translate at least partially out of a rack to expose the lateral sides; and
enable hot-swapping of at least one of the hot-pluggable electronic components via an exposed one of the lateral sides of the chassis while maintaining operation of at least another one of the hot-pluggable electronic components.

7. The rack-mountable module of claim 6, wherein:
each hot-pluggable electronic component of the hot-pluggable electronic components is configured to communicatively couple with a remote instance of processor circuitry via a separate one of a plurality of communication cables extending through the interior of the chassis via an exhaust portion of the rear side.

8. The rack-mountable module of claim 7, wherein:
each hot-pluggable electronic component of the hot-pluggable electronic components includes one or more cabling interfaces facing an exhaust air plenum that is in air flow communication with the exhaust portion;
the plurality of communication cables are routed between the one or more cabling interfaces and a cable management arm through the exhaust portion; and
the cable management arm is coupled to the rack and configured to accommodate movement of the plurality of communication cables such that communicative coupling of each hot-pluggable electronic component with the remote instance of processor circuitry is maintained when the chassis is translated at least partially out of the rack slot to expose the lateral sides.

9. The rack-mountable module of claim 6, wherein:
the rack-mountable module is further configured to direct cooling air from an intake portion of the front side to an exhaust portion of the rear side; and
the rack-mountable module further comprises:
an exhaust air plenum that is bounded at least in part by the hot-pluggable electronic components;
air passages that are individually configured to direct a separate portion of the cooling air across at least a portion of a respective hot-pluggable electronic component of the hot-pluggable electronic components and into the exhaust air plenum to remove heat from the respective hot-pluggable electronic component,
wherein at least one of the support structures at least partially defines one or more of the air passages.

10. The rack-mountable module of claim 9, wherein the at least one support structure includes:
base elements configured to couple the at least one support structure to a base of the chassis; and
a coupling mount configured to couple with the at least one hot-pluggable electronic component, wherein the coupling mount projects away from the base of the chassis such that the at least one hot-pluggable electronic component is in an elevated position, relative to the base of the chassis.

11. The rack-mountable module of claim 9, wherein:
the at least one support structure comprises at least one divider configured to partition at least two of the air passages from one another, such that each air passage of the at least two of the air passages is configured to direct a separate portion of the cooling air to flow, in parallel with a base of the chassis, across a separate hot-pluggable electronic component of the at least one hot-pluggable electronic component.

12. The rack-mountable module of claim 9, wherein:
the intake portion comprises at least two intake air vents; and
the rack-mountable module further includes:
at least two separate intake air plenums configured to receive cooling air from a separate intake air vent of the at least two intake air vents, wherein each intake air plenum is bounded by a separate intake air vent of the at least two intake air vents, a respective one of the opposing lateral sides, and a proximate set of the hot-pluggable electronic components.

13. The rack-mountable module of claim 6, wherein:
the hot-pluggable electronic components include at least two sets of hot-pluggable electronic components;
each set of the at least two sets of hot-pluggable electronic components extends at least partially through both a depth of the interior of the chassis and opposite directions through a width of the interior of the chassis; and
each set of the at least two sets of hot-pluggable electronic components extends in a staggered configuration through the interior of the chassis.

14. The rack-mountable module of claim 6, wherein the hot-pluggable electronic components include one or more mass storage devices.

15. A method, comprising:
translating a rack-mountable module at least partially out of a rack, wherein:
the rack-mountable module includes:
a chassis, comprising:
a front side;
a rear side opposite the front side;
a top side;
a bottom side opposite the top side; and
opposing lateral sides; and
hot-pluggable electronic components located within the chassis interior; and
a plurality of support structures coupled to the chassis and configured to couple the hot-pluggable electronic components in an arrangement that at least partially establishes a progressively narrowing air plenum; and
hot-swapping at least one of the hot-pluggable electronic components, while maintaining operation of at least another one of the hot-pluggable electronic components, wherein said hot-swapping comprises:
decoupling a first hot-pluggable electronic component of the hot-pluggable electronic components from at least one of the support structures; and
removing the first hot-pluggable electronic component from the rack-mountable module via an exposed lateral side of the chassis.

16. The method of claim 15, wherein the hot-swapping further includes:
maintaining, during the hot-swapping of the first hot-pluggable electronic component, communicative coupling of the second hot-pluggable electronic component with a remote instance of processor circuitry via at least one communication cable extending through the interior of the chassis via an exhaust portion of the rear side.

17. The method of claim 15, wherein the hot-swapping further includes:
replacing the first hot-pluggable electronic component with a third hot-pluggable electronic component of the hot-pluggable electronic components, wherein the replacing includes:
coupling, during a time period that occurs after removing the first hot-pluggable electronic component from the rack-mountable module, the third hot-pluggable device to the at least one support structure via the exposed lateral side of the chassis or another exposed lateral side of the chassis.

18. The method of claim 15, wherein the translating includes exposing the lateral sides of the chassis, the method further comprising:
translating, during a time period that occurs after the hot-swapping, the rack-mountable module back into the rack such that the lateral sides of the chassis are not exposed.

19. The method of claim 15, further comprising:
directing cooling air from an intake portion of the front side to an exhaust portion of the rear side such that the cooling air removes heat from a first hot-pluggable electronic device of the hot-pluggable electronic devices without the cooling air being preheated by a second hot-pluggable electronic device of the hot-pluggable electronic devices, wherein the second hot-pluggable electronic device is upstream from the first hot-pluggable electronic device.

* * * * *